(12) United States Patent
Habib et al.

(10) Patent No.: US 7,653,888 B2
(45) Date of Patent: Jan. 26, 2010

(54) SYSTEM FOR AND METHOD OF INTEGRATING TEST STRUCTURES INTO AN INTEGRATED CIRCUIT

(75) Inventors: Nazmul Habib, South Burlington, VT (US); Robert McMahon, Essex Junction, VT (US); Troy Perry, Georgia, VT (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 11/739,838

(22) Filed: Apr. 25, 2007

(65) Prior Publication Data
US 2008/0270954 A1    Oct. 30, 2008

(51) Int. Cl.
  G06F 17/50  (2006.01)
  G06F 9/45   (2006.01)
(52) U.S. Cl. .............................................. 716/5; 716/3
(58) Field of Classification Search ...................... 716/5, 716/3
See application file for complete search history.

(56) References Cited

U.S. PATENT DOCUMENTS

| | | | |
|---|---|---|---|
| 5,845,234 A * | 12/1998 | Testa et al. ................. 702/119 |
| 6,487,700 B1 * | 11/2002 | Fukushima ..................... 716/4 |
| 6,505,137 B1 * | 1/2003 | Evans et al. .................. 702/119 |
| 6,512,392 B2 | 1/2003 | Fleury et al. |
| 7,196,350 B2 * | 3/2007 | Smayling et al. .............. 257/48 |
| 7,366,652 B2 * | 4/2008 | Wang et al. ................... 703/28 |
| 7,382,149 B2 * | 6/2008 | Anand et al. ................ 324/769 |
| 2006/0069958 A1 | 3/2006 | Sawicki et al. |
| 2006/0075366 A1 | 4/2006 | Jeong et al. |
| 2006/0255825 A1 | 11/2006 | Smayling et al. |

OTHER PUBLICATIONS

PCT/US 08/59967 International Search Report and Written Opinion.

\* cited by examiner

*Primary Examiner*—Jack Chiang
*Assistant Examiner*—Brandon W Bowers
(74) *Attorney, Agent, or Firm*—W. Riyon Harding

(57) ABSTRACT

A system and method for performing device-specific testing and acquiring parametric data on integrated circuits, for example ASICs, such that each chip is tested individually without excessive test time requirements, additional silicon, or special test equipment. The testing system includes a device test structure integrated into unused backfill space in an IC design which tests a set of dummy devices that are identical to a selected set of devices contained in the IC. The device test structures are selected from a library according to customer requirements and design requirements. The selected test structures are further prioritized and assigned to design elements within the design in order of priority. Placement algorithms use design, layout, and manufacturing requirements to place the selected test structures into the final layout of the design to be manufactured.

20 Claims, 26 Drawing Sheets

Placement Options Table 2300

|  | 1200a | 1200b | 1200c |
|---|---|---|---|
| TS3 | 1800a, 1800b, 1800i | 1800b, 1800c', 1800d' | 1800k, 1800f, 1800g' |
| TS50 (Control Block) | 1800a', 1800j' | 1800c', 1800d' | 1800g' |
| DUT 1 | 1800i | 1800b | 1800k |
| DUT 2 | 1800i, 1800j | 1800c, 1800d' | 1800m |
| DUT 3 | 1800a' | 1800b, 1800d | 1800k', 1800m' |
| DUT 4 | 1800a' | - | 1800k', 1800m' |
| TS2 | 1800a', 1800j', 1800i' | 1800b, 1800c' | 1800m, 1800g, 1800k', 1800f' |
| TS1 | - | - | - |

Test Structure Assignment List 935

| | 1 | 2 | 3 |
|---|---|---|---|
| TS3 | 1800a | 1800b (Share with TS2) | 1800k |
| TS50 | 1800j | 1800d | - |
| DUT 1 | 1800i | 1800b | - |
| DUT 2 | 1800i | 1800c | - |
| DUT 3 | 1800a | 1800d | - |
| DUT 4 | 1800a | Tie Off | - |
| TS2 | - | 1800b (share with TS3) | - |
| TS1 (Add to unused test structures 945) | - | - | - |

*Fig. 25*

SYSTEM FOR AND METHOD OF INTEGRATING TEST STRUCTURES INTO AN INTEGRATED CIRCUIT

CROSS REFERENCES RELATED TO THE APPLICATION

This application is related to pending U.S. application Ser. No. 11/459,367 assigned to the present assignee.

BACKGROUND OF THE INVENTION

1. Field of the Invention

The invention relates to the field of acquiring manufacturing process data on a part-by-part basis (e.g. chip), and more specifically, to providing a means to acquire device data with which to perform a detailed product analysis, which is further used to tune the manufacturing processes.

2. Background of the Invention

Due to the complex and precise nature of semiconductor manufacturing, it is critical to ensure that all processes in the manufacturing line are within required specifications. This ensures the highest product yield. Monitoring the manufacturing process and correcting for deficiencies is critical for maintaining the health of the line (HOL).

Some testing is done in-line during manufacturing to tune the process real-time, and other tests are performed after manufacturing. Kerf testing is a common type of testing and provides information for a group of die on a wafer relating to process, voltage, and temperature (PVT). Other tests include: I/O receiver/driver levels, performance screen ring oscillator (PSRO) testing, and MUX scan testing, also known as "at speed" testing.

The problem with kerf testing is that it does not provide detailed information specific to each die on the wafer and further, cannot provide information about the electrical parameters of certain devices within each of the chips; especially custom designs which have smaller manufacturing lot sizes, device dimensions which vary from standard devices, and other product-specific qualities.

Since in-line testing is time consuming and expensive, it is important to perform adequate testing within a minimal amount of time. Generally, testing is done by sampling a set of kerfs to obtain an overall HOL measurement. For customized circuits, such as application specific integrated circuits (ASIC) testing by sampling does not provide an accurate assessment of device parameters within each die of the wafer. Maintaining device parameters within specifications is critical for improving yield and ensuring that customer requirements and delivery expectations are met.

BRIEF SUMMARY OF THE INVENTION

Based on the issues identified above, what is needed is a means for accurately testing customized circuitry so that adequate feedback can be relayed to the manufacturing line to ensure the highest possible yields. It is a further requirement that the testing process does not take an exceptional amount of time, nor take excessive silicon real estate and therefore, affect cost. The testing process must be adaptable to meet specific testing requirements without providing unnecessary test structure overhead.

The present invention is a system and method of integrating a test structure into a physical integrated circuit design (i.e. into a netlist), typically in the backfill. The test structure and corresponding system provides accurate electrical and physical measurements of the circuit and its devices on an associated die. Test structure 100 is shown in FIG. 1 and includes a logic controller 110 having a decoder for activating one or more device under test (DUT) structures 170 and 180, a decode level translator (DLT) 120, which provides a required logic level or required voltage to one or more DUT structures 170 or 180, and a protection circuit which isolates the integrated circuit when the test system is inactive.

Test structure 100 may operate in either a single or dual supply mode. In the single supply mode, during wafer final test (WFT) and/or module final test (MFT), the current ($I_{on}$) measurement for each DUT 170 and/or 180 is calculated and recorded. In dual supply mode, a control block 190 controls the voltage to a DUT 170 and/or 180 gate, for example, as well as provides power to the DUT 170 and/or 180 source and/or drain. Measurements for threshold voltage ($V_t$), $I_{on}$, and effective current ($I_{eff}$) for each DUT 170 and/or 180 are then calculated and recorded.

Test structure 100 is a device performance monitor within application specific integrated circuits (ASIC). The macro represents all device types and design points used on an ASIC chip. Test structure 100 may be, for example, integrated with the existing electronic chip identification macro (ECID: used at IBM) or placed near a performance screen ring oscillator (PSRO), placed as a standalone macro, or placed non-contiguously such that control block 190 is placed in a physically separate location on a chip from DUTs 170 or 180.

Test structure 100 provides several unique, user-defined device tests. All tests include measuring and recording applicable parameters of on-chip devices such as average $I_{on}$, $V_t$, and $I_{eff}$ pertaining to an array of FETs. The tests account for spatial variations. Each DUT 170 and/or 180 in this specification refers to but is not limited to nFET or pFET devices. DUTs 170 and/or 180 may also be wires, resistors, capacitors, inductors, and other circuit components. Additionally, across chip variation (ACV) data can be extracted and analyzed by placing multiple test structures 100 on a single chip.

During release checking, all device types and design points on a particular IC chip are determined and matched with those present in a test structure 100. If test structure 100 contains DUTs 170 and/or 180 that are not part of the IC design, then that test structure 100 will not be included in the design. Test structure 100 must not drive unique mask requirements. Only test structures 100 which are compatible with the IC will be chosen. Information describing what is both on the chip and in test structure 100 will be relayed to the manufacturing and test engineers.

Test structures 100 may be integrated into the design and coupled to existing ECID macros, which contain at least one fatwire I/O with very low-resistance requirements (<10 Ohms guaranteed). The fatwire I/O is connected to a Precision Measurement Unit (PMU) at test which will be used for accurate voltage force and current measure activity.

Determination for the number, type, location, and routing of required test structures 100 per chip is defined during the chip design process. Customer directives, internal rules, and historical data provide requirements for selection, synthesis, and placement of the test structures 100. These requirements include, but are not limited to: available backfill, distance from the fatwire I/O, proximity to critical logic macros, e.g. PSROs used to guarantee product performance, continuity of test structures 100, desired test data for analysis, and minimum distances between test structures 100 for the design. One of ordinary skill in the art can appreciate the many requirements and specifications that must be maintained and adhered to in the design and manufacture of ICs.

The process of integrating test structures 100 into a customer design (e.g. netlist) includes identifying discrete elements within the design and comparing a library of test structures 100, each having varying DUTs 170 and 180. Test structures 100 which match various discrete elements are stored in a list. The list is further prioritized according to requirements including but not limited to: customer directives, internal rules, and historical data. A data structure comprising available fatwire I/O and other elements along with possible placement blocks (e.g. areas) on the die for test structures 100 is used to process and assign the prioritized list of test structures 100 to optimum elements and placement areas to the extent possible. Test structures 100 which are placeable, are synthesized in the netlist and placed using place and route tools. Final design checking is performed to ensure compliance with DFM rules. Test structures 100 that cause failures are removed from the netlist, the netlist resynthesized and checked. The process iterates until all DFM tests pass. The final netlist is recorded as a data structure, which is then released to manufacturing (i.e. tape-out) for example, as a GDSII file.

BRIEF DESCRIPTION OF THE DRAWINGS

FIG. 25 is a table of final placement blocks for each of the placeable test structures.

DETAILED DESCRIPTION OF THE INVENTION

Figure 1:
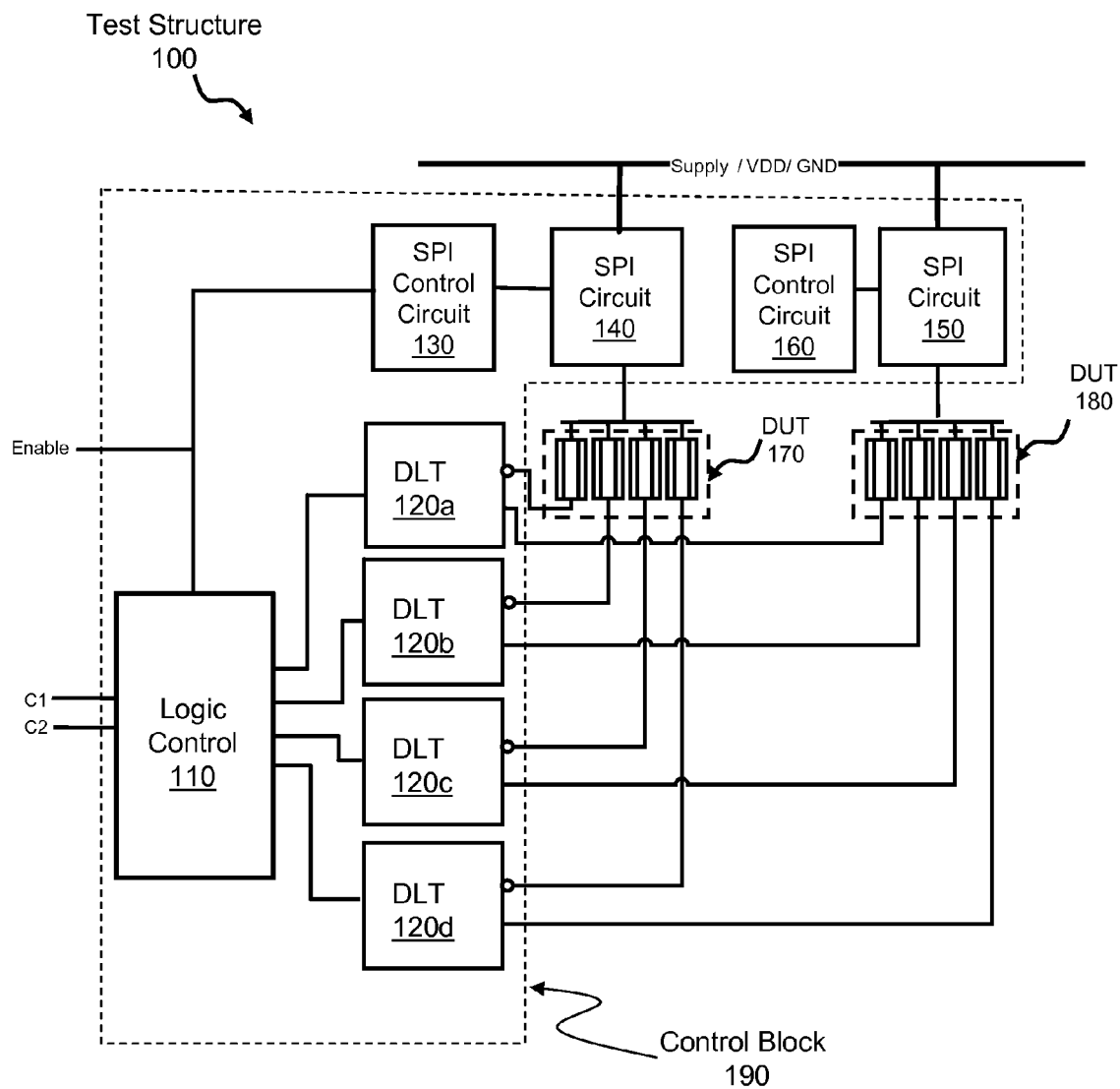
FIG. 1 is a system level block diagram of a test structure.

FIG. 1 shows a test structure 100 of the present invention. Test structure 100 includes a control block 190, which further includes logic control 110, a group of decode level translators (DLT) 120*a-d* (four DLTs are shown in this example), a pFET SPI circuit 140 coupled to an SPI control circuit 130, and an nFET SPI circuit 150 coupled to SPI control circuit 160. Test structure 100 further includes a DUT 170, which represents one device type (in this example, an array of pFETs) and a DUT 180, which represents a second device type (in this example, an array of nFETs). Each of DUTs 170 and 180 are coupled to control block 190.

In operation, control block 190 exercises corresponding DUTs 170 and/or 180 and provides resulting test data to a test apparatus (not shown). Each element of test structure 100 is further discussed in the following figures.

Figure 2:
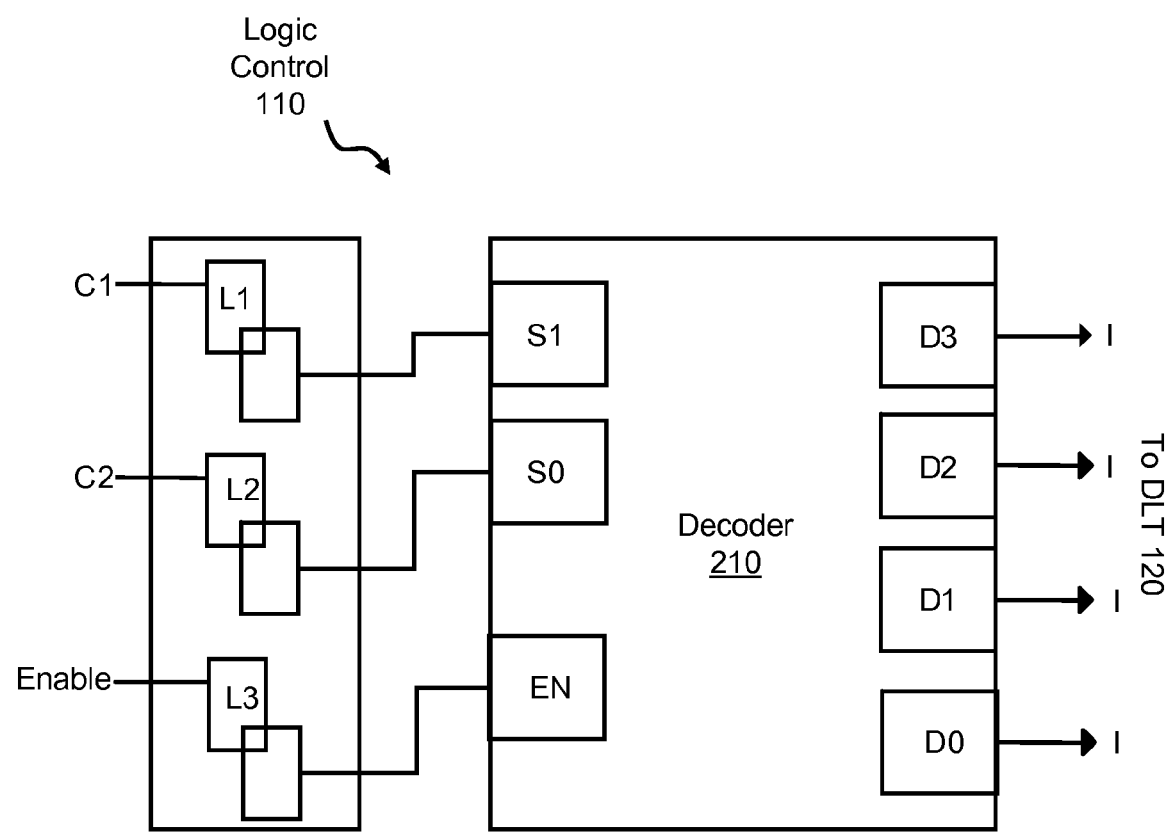
FIG. 2 is a block diagram of the logic control.

FIG. 2 shows logic control 110, which includes a control signal C1 coupled to a latch L1, which is further connected to a pad S1 of a decoder 210. Control signal C2 is coupled to a latch L2, the output of which is coupled to a pad S0 of decoder 210. An enable signal, EN, is coupled to a third latch L3, the output of which is coupled to a pad EN of decoder 210. Decoder 210 further comprises a series of outputs D0-D3, which are each coupled to DLT 120*a-d* respectively.

Logic control 110 enables each DUT 170 or 180 to be activated individually for test. Decoder 210 is shown in FIG. 2 as a 2:4 decoder for illustrative purposes but need not be limited to a 2:4 decoder. Since DUT 170 and DUT 180 experiments are separated, decoder 210 behaves as a 2 to 8 decoder, controlling DUT 170 and DUT 180 with each decoder output. Typical decode sizes will be 4:16 or 5:32, which will achieve capability of controlling 32 to 64 DUTs. If EN is low, decoder 210 outputs D0-D3 will be low, which ensures all DUT 170 and DUT 180 gates are off.

Figure 3:
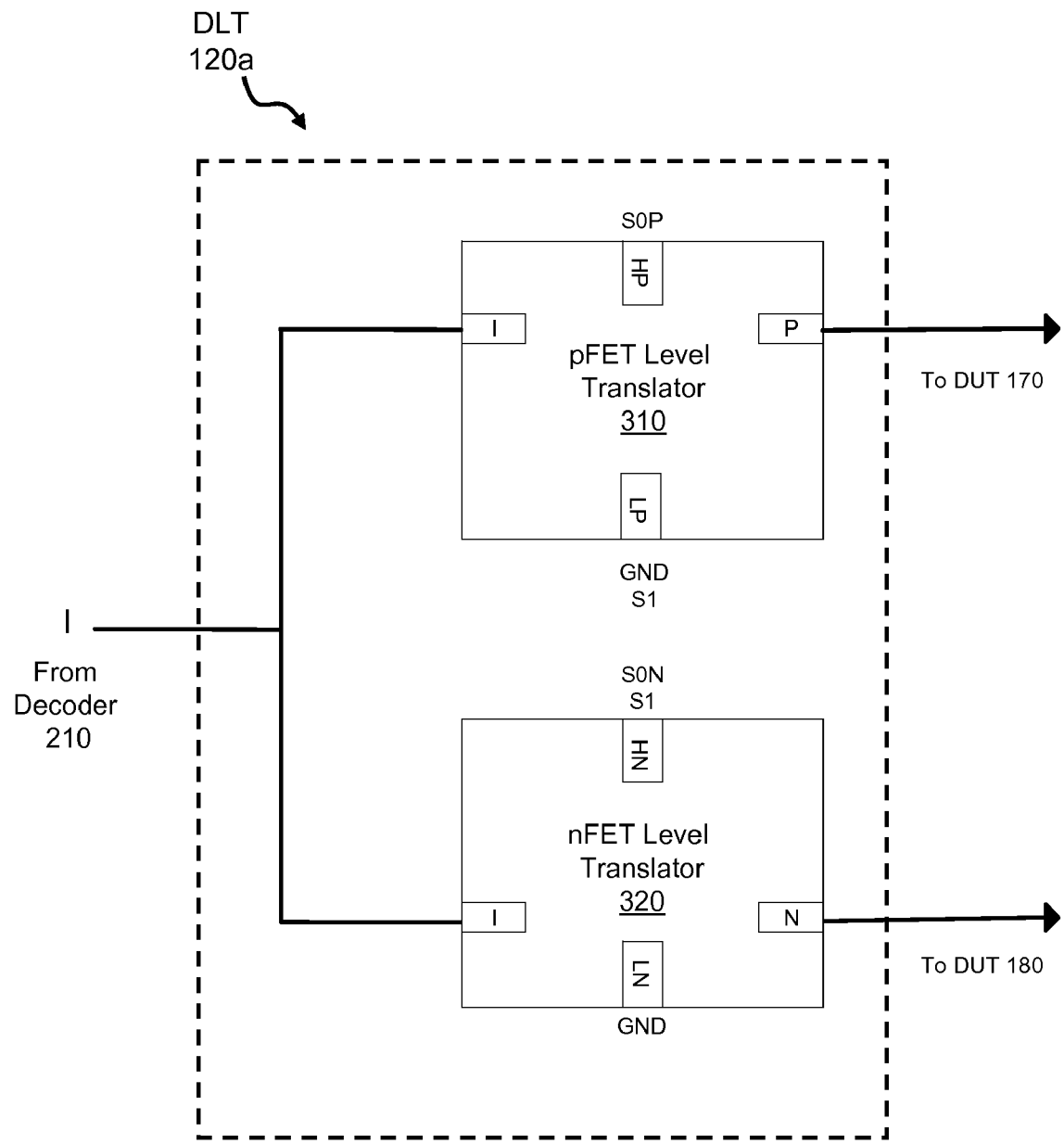
FIG. 3 is a block diagram of the decode level translator (DLT).

FIG. 3 shows a detailed diagram of DLT 120*a*. DLT 120*a* is exemplary of any of DLT 120*b-d* and thus will serve to explain DLT 120 functionality and structure by way of example. DLT 120*a* includes an input signal, I, from output D3 of decoder 210, a pFET level translator 310, and an nFET level translator 320. pFET level translator 310, further includes an input pad, I, an output pad, P, which is coupled to DUT 170, a second input pad, HP, and a third input pad, LP. nFET level translator 320 includes an input pad, I, which activates/deactivates DLT 120*a*, an output pad, N, which is coupled to DUT 180, a second input pad, HN, and a third input pad, LN. pFET level translator 310 and nFET level translator 320 are shown in detail in FIGS. 4 and 5 respectively.

In operation, input I to DLT 120*a* comes from decoder 210. When the output signal D3 from decoder 210, which is connected to the I pin of DLT 120*a*, is high, the P and N outputs of DLT 120*a* are active (i.e. N=1, and P=0), which turns on the associated DUT 170 gates, as well as the associated DUT 180 gates. The supply voltage inputs to DLT 120*a* are shown in Table 1 below.

TABLE 1 values of HP, LP, HN and LN for single and dual supply modes

|    | Single | Dual |
|----|--------|------|
| HP | S0P    | S0P  |
| LP | GND    | S1   |
| HN | S0N    | S1   |
| LN | GND    | GND  |

In Table 1, "single" supply represents DUT 170 and DUT 180 input from a single voltage source (S0P, S0N) which will drive simple logic 1's and 0's to DUT 170 and DUT 180 respectively.

In Table 1, "dual" represents input from two distinct voltage supplies where HN on nFET level translator 320 receives the signal S1 and LP on pFET level translator 310 also receives the signal S1.

In dual supply mode, S1 is sent to the gates of DUT 170 and 180 from outputs P and N respectively. S1 can be swept to determine the switching voltage ($V_{th}$) and FET current ($I_{ON}$) of DUT 170 and DUT 180.

In general, DLT 120 enables logic control 110 to control DUTs 170 and 180 residing in different voltage realms. DLT 120 provides a means for communication between two voltage domains including Vdd, supplied to control logic 110, and test structure "Supply/VDD/GND" used to generate S0 for DLT 120. The purpose of DLT 120 is to provide accurate logic levels and/or analog gate voltages to DUT 170 and DUT 180 in order to perform device level testing. In the case of BEOL characterization, either nFET level translator 320 or pFET level translator 310 will be used, depending on the FET type used to control DUT 120. Equalizing DUT experiments (equal n and p experiments) optimize use of the test structure.

Figure 4:
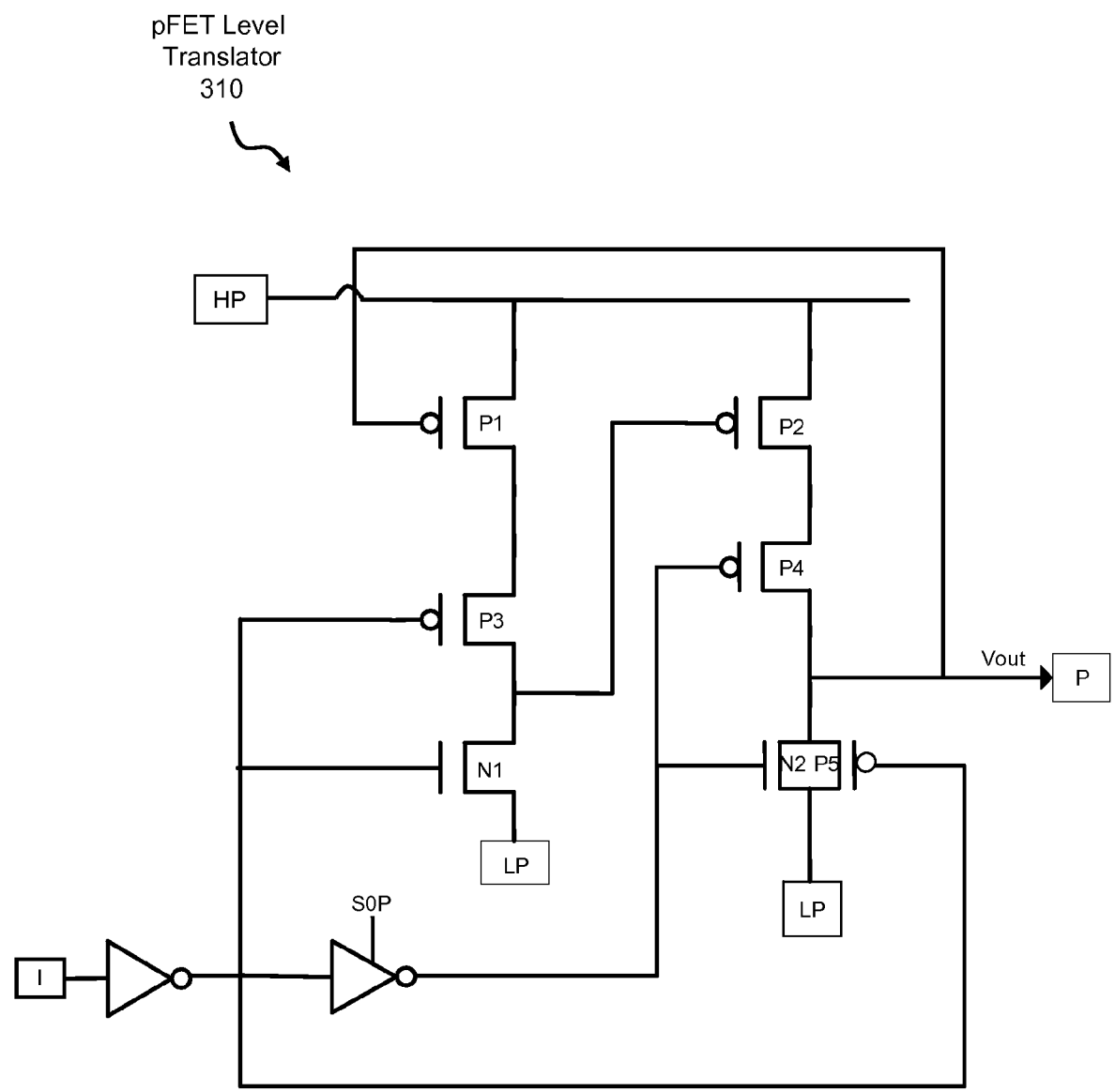
FIG. 4 is a schematic diagram of a pFET DLT (pDLT).

FIG. 4 shows a detailed schematic diagram of pFET level translator 310 which includes pFETs P1-P5, nFETs N1-N2, and a first inverter whose input is I. This inverter is serially connected to a second S0P powered inverter. HP and LP are driven according to the type of test, as shown in Table 1. The output P is sent to DUT 170.

The input to pFET level translator 310 is inverted by the first inverter to achieve an opposite output state when enabled, which is required by pFETs associated with DUT 170. In a single supply application, e.g. applying S0P to HP, the output of pFET level translator 310 has the opposite logic level with respect to the input.

In a dual supply application, S1 is applied to LP. GND is replaced by S1 to allow voltage sweeping through a pass-gate, shown in FIG. 4 as FETs N2 and P5, to DUT 170 gates.

Figure 5:
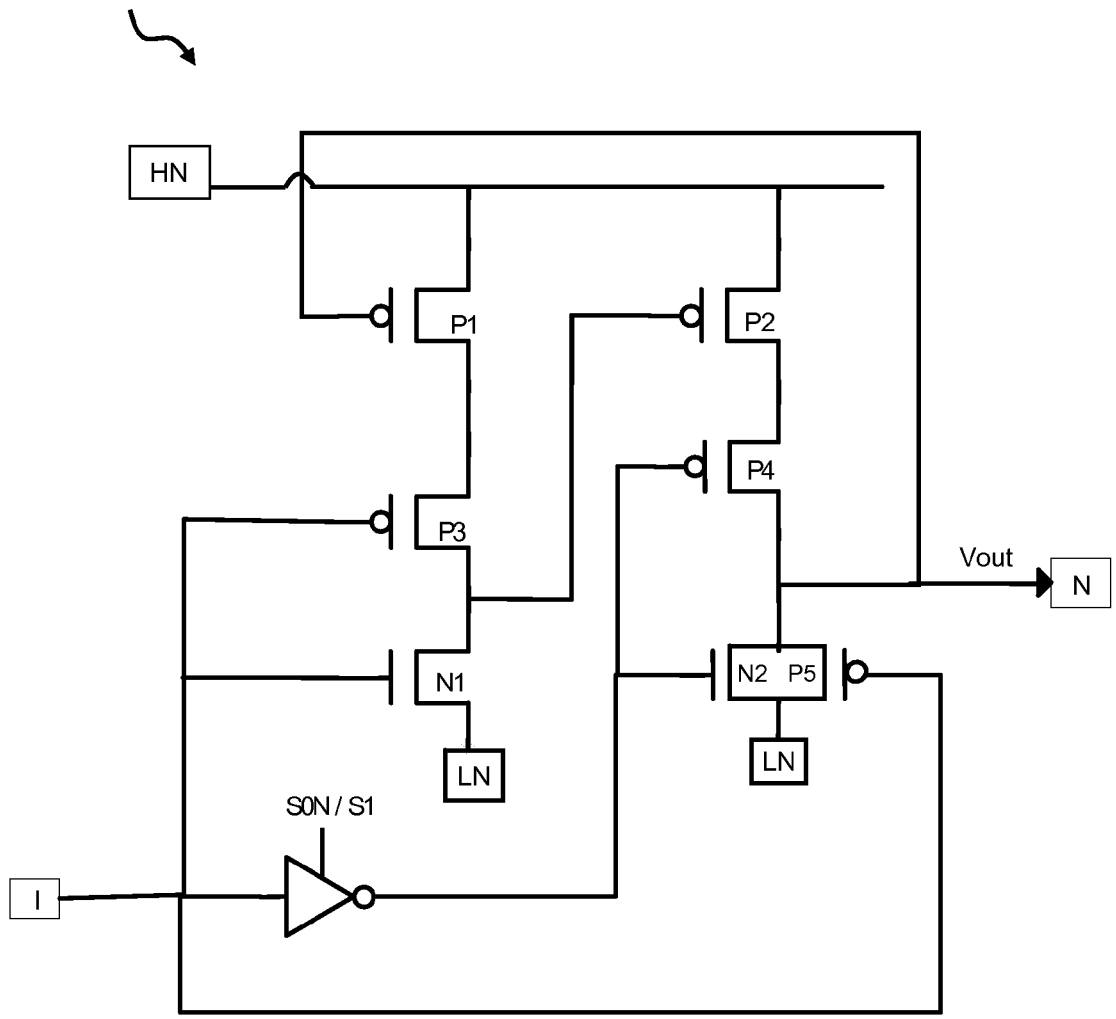
FIG. 5 is a schematic diagram of an nFET DLT (nDLT).

FIG. 5 shows a detailed schematic diagram of nFET level translator 320 which includes pFETs P1-P5, nFETs N1-N2, an inverter whose input is I, and is powered by either S0N or S1. HN and LN are driven according to the type of test, as shown in Table 1. The output N is sent to DUT 180.

nFET level translator 320 has an input which is non-inverting. The power supply for nFET level translator 320 may originate from a derivative of the entire test structure power supply (S0N), or from a separate power supply (S1). S1 controls analog gate voltages for DUT 180.

Figure 6:
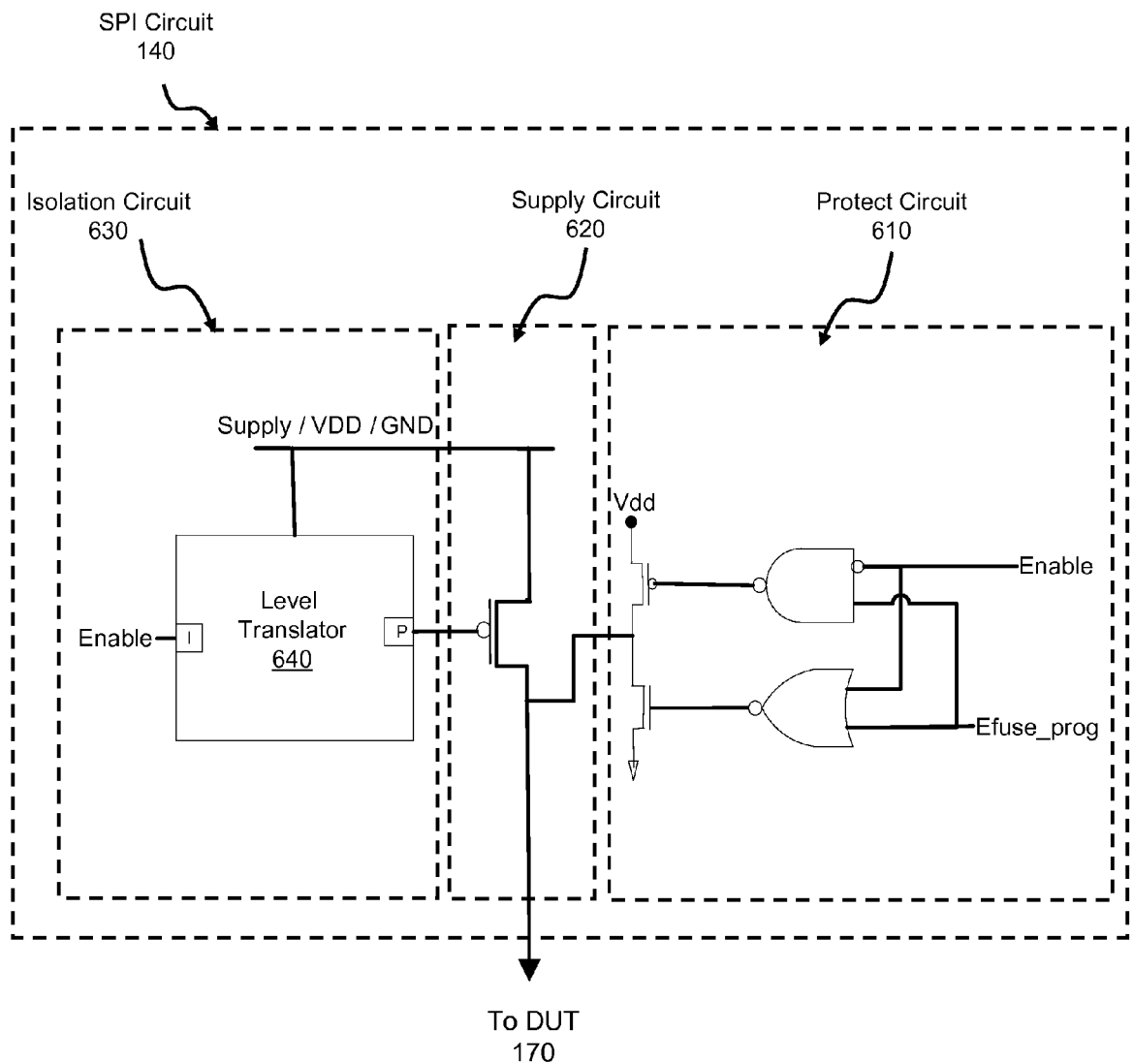
FIG. 6 is a schematic of a supply/protect/isolate (SPI) circuit.

FIG. 6 is a schematic block diagram of SPI circuit 140 which includes a protect circuit 610, a supply circuit 620, and an isolation circuit 630. Isolation circuit 630 further includes level translator 640 having a supply/VDD/GND power supply, an enable input I, and an output P, which is coupled to a pFET of supply circuit 620. A detailed schematic diagram of isolation circuit 630 is shown in FIG. 7 and described below.

Figure 7:
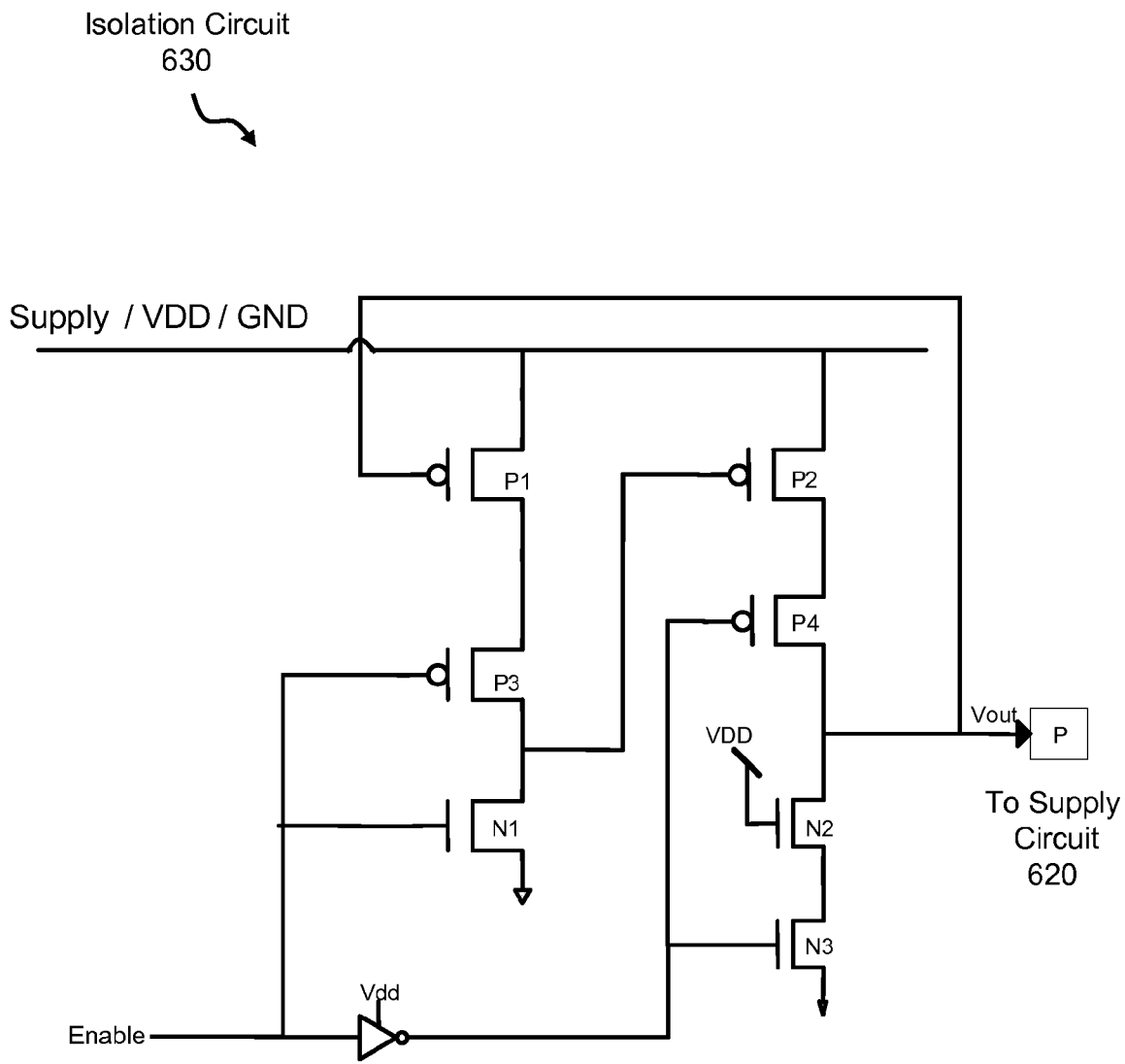
FIG. 7 is a detailed schematic diagram of the isolation circuit.

Level translator 640 of FIG. 7 includes pFETs P1-P4, nFETs N1-N3, and a Vdd powered inverter which has input I. Isolation circuit 630 electrically isolates DUT 170 so that the actual ASIC circuitry is not affected during test, nor is it affected by any leakage current from DUT 170 while the test structure is not in operation. Level translator 640 routes the supply voltage (Supply/VDD/GND) directly to the corresponding gate of the supply pFET in supply circuit 620 of FIG. 6.

Since the test structure separates nFET and pFET DUTs, it supplies each with a dedicated SPI structure. Only one of SPI circuits 140 or 150 is activated at a time. This is accomplished by selecting the appropriate SPI circuit 140 or 150 to activate using either SPI control circuit 130 or SPI control circuit 160 respectively. Although FIG. 6 shows SPI circuit 140, it is meant to be exemplary of any SPI circuit, including SPI circuit 150 and therefore SPI circuit 150 will not be discussed in further detail.

Figure 8A:
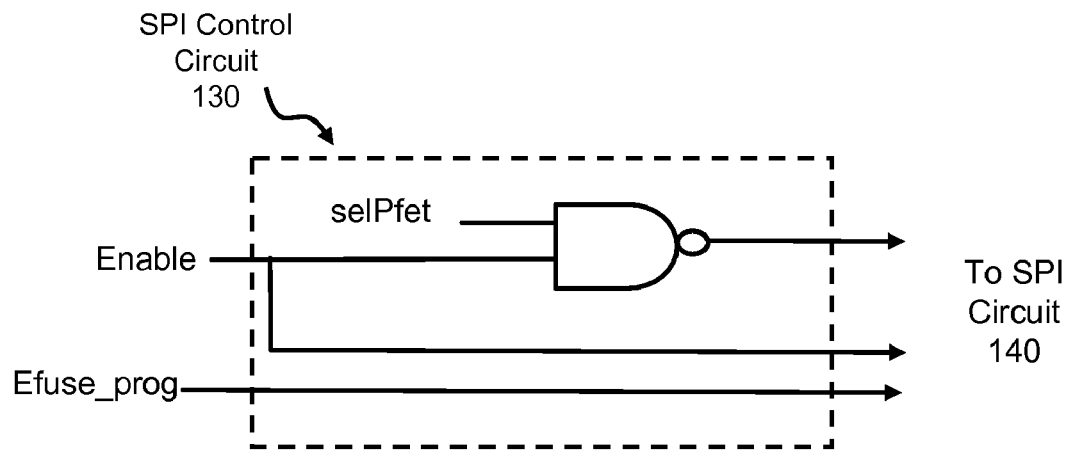
FIG. 8*a* is a logic diagram of an SPI control circuit for selecting pFET structures during test.
Figure 8B:
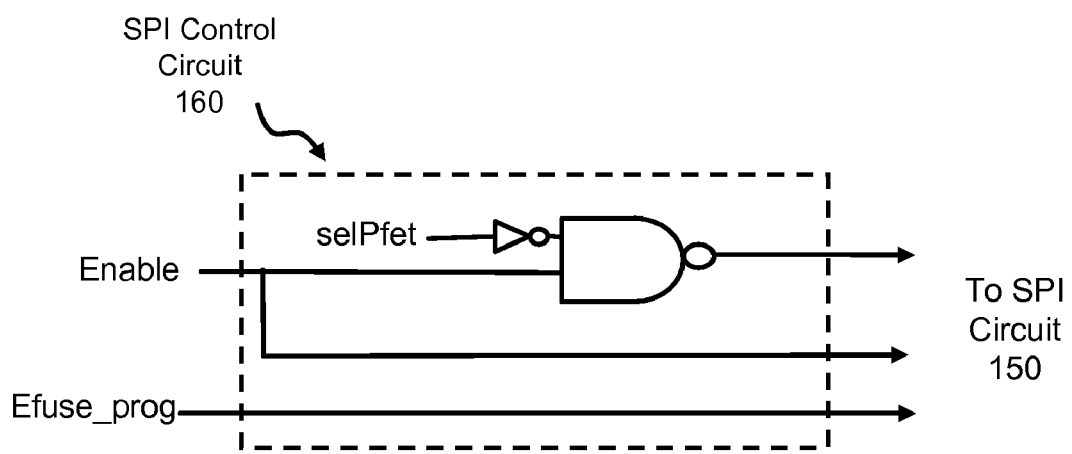
FIG. 8*b* is a logic diagram of an SPI control circuit for selecting nFET structures during test.

FIG. 8a shows a logic diagram of SPI control circuit 130 and FIG. 8b shows a logic diagram of SPI control circuit 160. SPI control circuit 130 further includes an Enable signal, an Efuse_prog signal, a selPfet signal, and a NAND gate having inputs from Enable and selPfet, which comes from a latch on the chip (not shown). The Enable, and Efuse_prog signal are further coupled to protect circuit 610. The NAND output directly feeds the I input of SPI circuit 140. By choosing only one SPI circuit at a time (using selPfet, and Enable), current through unused SPI circuit 150 is gated to reduce incidental leakage. Efuse_prog exists to protect non-test structure ASIC circuits (not shown). Since the test structure shares the Supply/VDD/GND pin with ASIC circuits, the existing Efuse_prog signal is used to isolate the test structure from other ASIC operations and vise versa.

The supply voltage is sourced through supply circuit 620. Supply circuit 620 includes a large supply pFET which sends an output signal to DUT 170. The gate of the supply pFET is coupled to the output of isolation circuit 630, the source is connected to Supply/VDD/GND, and the drain is connected to the output of protect circuit 610. The supply pFET is sufficiently large to ensure it will have a minimum voltage drop during test structure measurements (<50 mV), but robust enough to handle high voltages, which may be at or above 3.0V.

SPI protect circuit 610 protects the supply pFET of supply circuit 620 from excessive source to drain, and gate to drain potential differences when high voltages are applied to Supply/VDD/GND (fatwire I/O). During high voltage applications, Supply=3.0 v and the test structure is inactive (off), i.e. all DUTs 170 and 180 are turned off. When Enable=0 and Efuse_prog=1, VDD is forced through protect circuit 610 and onto the drain of the supply pFET of supply circuit 620. The largest potential difference across the supply pFET is guaranteed to never be larger than Supply minus VDD. Simulation was completed to verify this voltage level is not damaging to the supply pFET.

In the single supply mode of operation either during wafer or module final test (WFT, MFT), a tester (not shown) calculates the current by measuring the background current ($I_{BG}$) and DUT current ($I_{MEAS}$) for each of DUT 170 and DUT 180. $I_{ON}$ is equal to the difference between $I_{MEAS}$ and $I_{BG}$ (i.e. $I_{ON}=I_{MEAS}-I_{BG}$). The tester records the $I_{ON}$ data for both DUT 170 and DUT 180. Table 2 shows a truth table for the Single Mode of operation used for controlling the test structure DUTs.

TABLE 2

Example truth table for single supply mode

| Input | | | | | Single Mode | | | | | | | |
|---|---|---|---|---|---|---|---|---|---|---|---|---|
| selPfet | C1 | C2 | S0P | S0N | P0 | P1 | P2 | P3 | N0 | N1 | N2 | N3 |
| 0 | 0 | 0 | S0P | 0 | GND | S0 | S0 | S0P | S0N | GND | GND | GND |
| 0 | 0 | 1 | S0P | 0 | S0 | GND | S0 | S0P | GND | S0N | GND | GND |
| 0 | 1 | 0 | S0P | 0 | S0 | S0 | GND | S0P | GND | GND | S0N | GND |
| 0 | 1 | 1 | S0P | 0 | S0 | S0 | S0 | GND | GND | GND | GND | S0N |
| 1 | 0 | 0 | 0 | S0N | GND | S0 | S0 | S0P | S0N | GND | GND | GND |
| 1 | 0 | 1 | 0 | S0N | S0 | GND | S0 | S0P | GND | S0N | GND | GND |
| 1 | 1 | 0 | 0 | S0N | S0 | S0 | GND | S0P | GND | GND | S0N | GND |
| 1 | 1 | 1 | 0 | S0N | S0 | S0 | S0 | GND | GND | GND | GND | S0N |

The test structure is also configurable to separately control the DUT 170 and 180 gate voltages. Dual supply mode testing enables threshold voltage, $V_t$, measurement capability, in addition to $I_{ON}$ measurement capability. In dual supply mode, effective current ($I_{eff}$) can be calculated. $I_{eff}$ is a better indicator of device performance than $I_{ON}$ alone. To implement dual supply mode a dedicated pad, S1, must be wired out. S1 is shown in FIG. 3 as LN and HP respectively.

Table 3 shows an example truth table for dual supply mode.

TABLE 3

Example truth table for dual supply mode

| Input | | | | | Dual Mode | | | | | | | |
|---|---|---|---|---|---|---|---|---|---|---|---|---|
| selPfet | C1 | C2 | S0P | S0N | P0 | P1 | P2 | P3 | N0 | N1 | N2 | N3 |
| 0 | 0 | 0 | S0P | 0 | S1 | S0P | S0P | S0P | S1 | GND | GND | GND |
| 0 | 0 | 1 | S0P | 0 | S0P | S1 | S0P | S0P | GND | S1 | GND | GND |
| 0 | 1 | 0 | S0P | 0 | S0P | S0P | S1 | S0P | GND | GND | S1 | GND |
| 0 | 1 | 1 | S0P | 0 | S0P | S0P | S0P | S1 | GND | GND | GND | S1 |
| 1 | 0 | 0 | 0 | S0N | S1 | S0P | S0P | S0P | S1 | GND | GND | GND |
| 1 | 0 | 1 | 0 | S0N | S0P | S1 | S0P | S0P | GND | S1 | GND | GND |
| 1 | 1 | 0 | 0 | S0N | S0P | S0P | S1 | S0P | GND | GND | S1 | GND |
| 1 | 1 | 1 | 0 | S0N | S0P | S0P | S0P | S1 | GND | GND | GND | S1 |

Test structure 100 may be placed in various locations within an ASIC design to test different areas of the same chip. Alternative DUT 170/180 structures may also be incorporated into the design such that each test structure is able to test a particular DUT structure in proximity to it. A single test structure 100 may also be designed to test multiple varieties of DUT 170 and/or 180 structures, such as wires, resistors, capacitors, inductors, etc., within a specific chip location. The following figures provide examples of integrating test structure 100 into a circuit design. The following examples are shown for illustrative purposes and are not intended to limit the invention to only those configurations illustrated. One of ordinary skill in the art will appreciate other configurations within the scope and spirit of the present invention.

Figure 9:
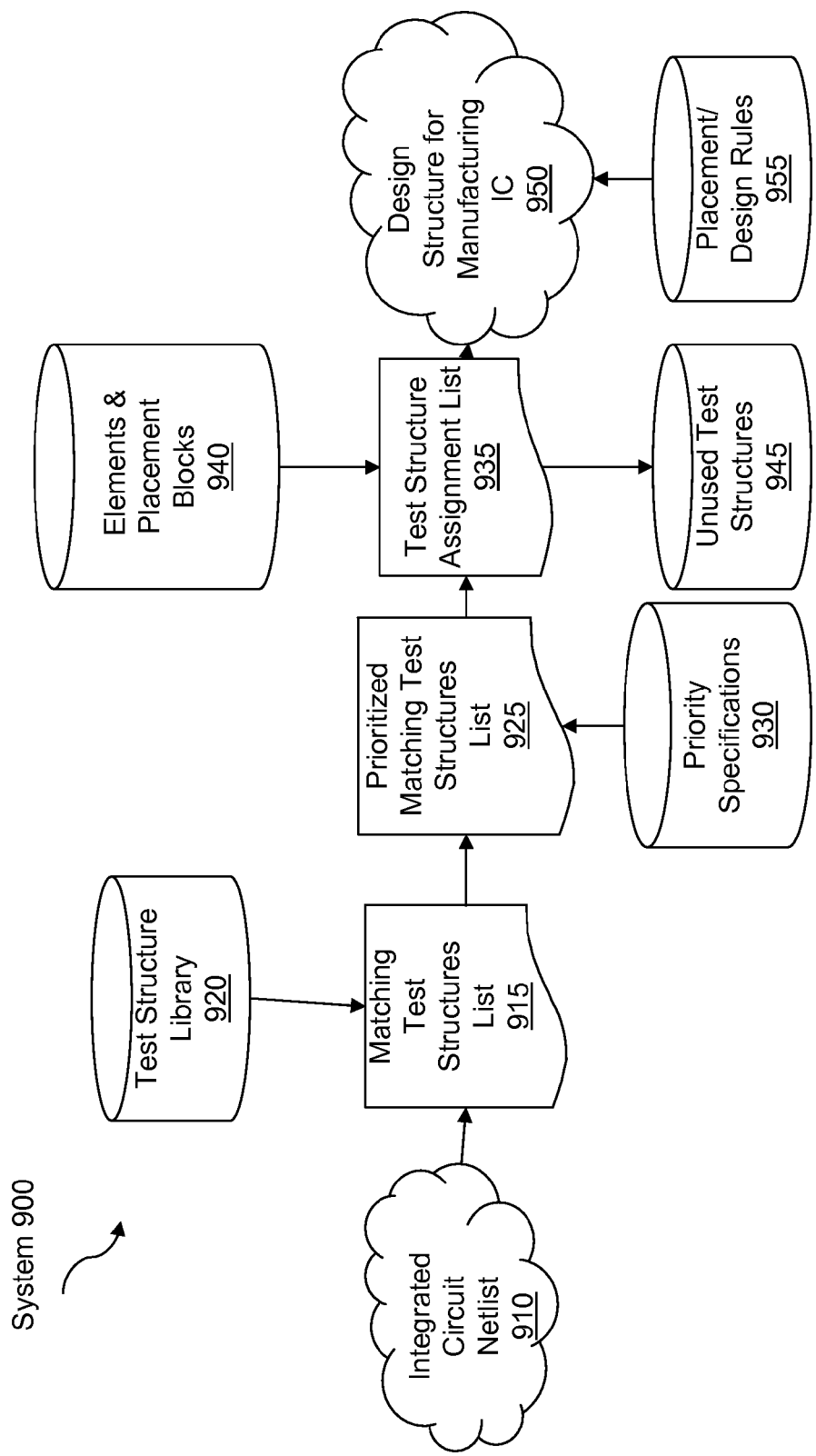
FIG. 9 shows a system block diagram of the test structure integration system of the present invention.

FIG. 9 shows a system 900 for integrating test structure 100 into an integrated circuit netlist 910. System 900 includes a test structure library 920, which generates a matching test structures list 915 according to integrated circuit netlist 910. A priority specifications 930 database provides prioritization information for generating a prioritized matching test structures list 925 from matching test structures list 915. An elements and placement blocks 940 database provides information to generate a test structure assignment list 935 from prioritized matching test structures list 925. An unused test structures 945 database receives all test structures 100 that are in prioritized matching test structures list 925 but not test structure assignment list 935. System 900 further includes a placement/design rules 955 database to finalize placement and integration of test structures 100 resulting in a data structure 950 used for manufacturing the IC. Data structure 950 may be a GDSII file, for example. Data structure 950 comprises the at least one prioritized matching test structure 100 coupled to the at least one element of integrated circuit netlist 910.

Figure 10:
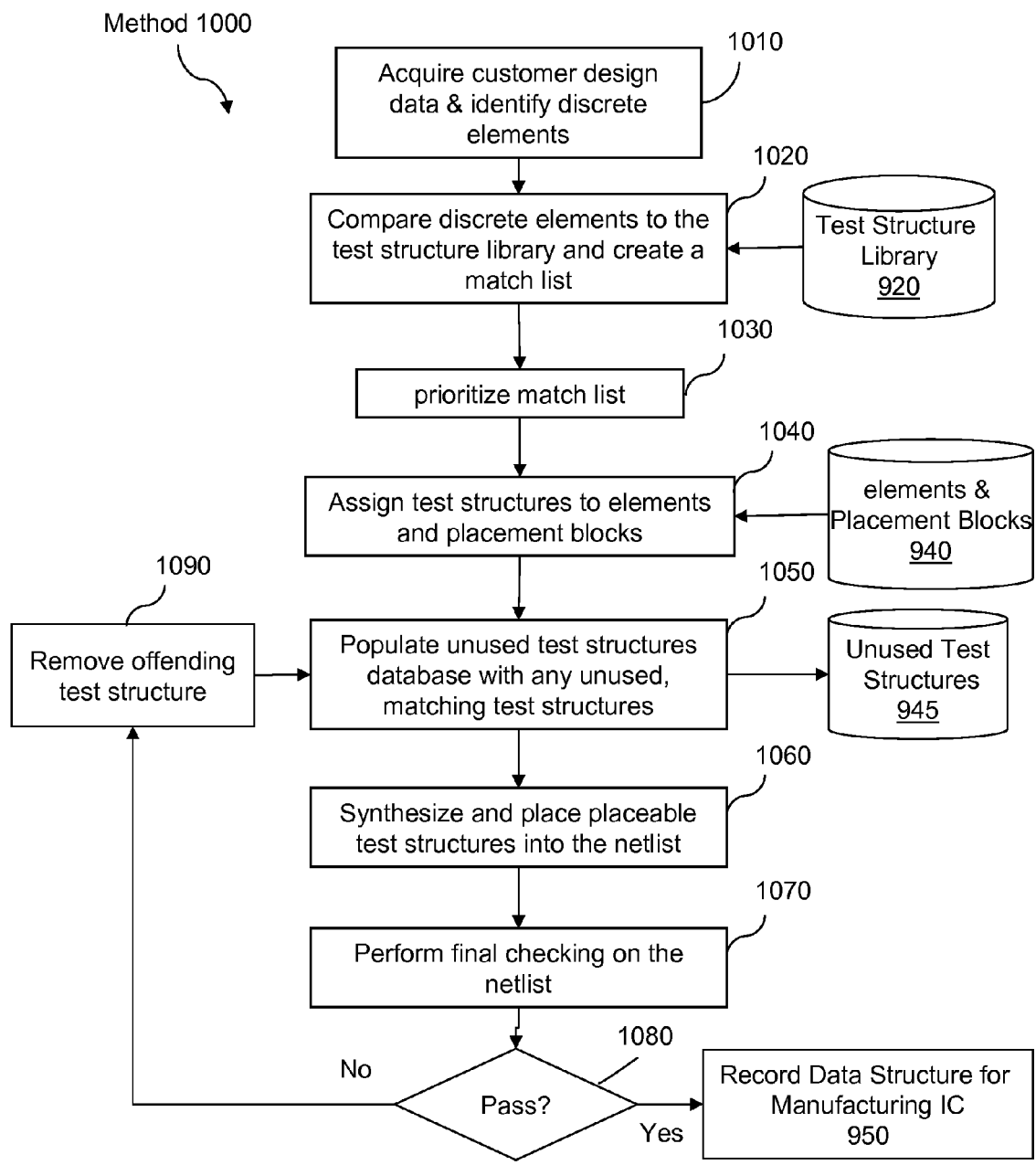
FIG. 10 is a flow diagram of one method of integrating the test structure of the present invention into a netlist.

FIG. 10 shows a method 1000 of operating system 900 to integrate test structures 100 into netlist 910. In step 1010, method 1000 identifies discrete elements or devices in customer netlist 910 which may be potential candidates for testing.

In step 1020, method 1000 compares the discrete devices identified in step 1010 with test structures 100 comprised in test structure library 920 and creates matching test structures list 915, which comprises a list of test structures 100 which contain DUTs 170 and/or DUTs 180, wherein DUTs 170 and/or DUTs 180 match at least one of the discrete devices in netlist 910.

In step 1030, method 1000 creates prioritized matching test structures list 925 by prioritizing matching test structures list 915. Method 1000 uses prioritization algorithms and prioritization data stored in priority specifications 930 database (see FIG. 11 for details) to prioritize test structures 100 located in matching test structures list 915 and generates prioritized matching test structures list 925. The highest priority discrete devices, elements, cores, IP, macros, etc. in netlist 910 will be the first to have an assigned test structure 100 and the corresponding test structures 100 are prioritized accordingly.

In step 1040, method 1000 assigns test structures 100 from prioritized matching test structures list 925 (beginning with the highest priority test structures 100) to elements (e.g. fat wires) of netlist 910 as provided by elements and placement blocks 940 database. Step 1040 continues until either 1. there are no more elements of netlist 910 capable of being assigned a test structure 100, 2. there are no more test structures 100 to assign, or 3. there is no physical space available (placement block) to insert another test structure 100 into netlist 910. Step 1040 is described in detail in FIGS. 19-22.

In step 1050, method 1000 populates unused test structures 945 database with test structures 100 which were listed in prioritized matching test structure list 925, but which were not assigned to a design element in step 1040.

In step 1060, method 1000 integrates selected test structures 100 into netlist 910 using placement/design rules 955 and synthesis tools to generate data structure 950. Several examples of test structure 100 placement into customer netlist 910 are shown in FIGS. 12-18.

In step 1070, method 1000 performs final checking algorithms on data structure 950 to ensure design for manufacturability requirements are met (e.g. release process rules, DRC, LVS, wire load checking, etc.). If any design checking rules fail, method 1000 makes the necessary placement and routing changes to ensure compliance with specifications such as, DFM rules, product specifications, functional design requirements. If no solution is found for a particular test structure 100, it is removed from data structure 950 and placed in unused test structures 945.

In step 1080, method 1000 determines whether data structure 950 passes all tests. If yes, method 1000 records final data structure 950 and exits. If no, method 1000 proceeds to step 1090.

In step 1090, method 1000 removes test structure 100 which is causing failure(s) and proceeds to step 1050. Method 1000 iterates until all checking algorithms pass.

Figure 11:
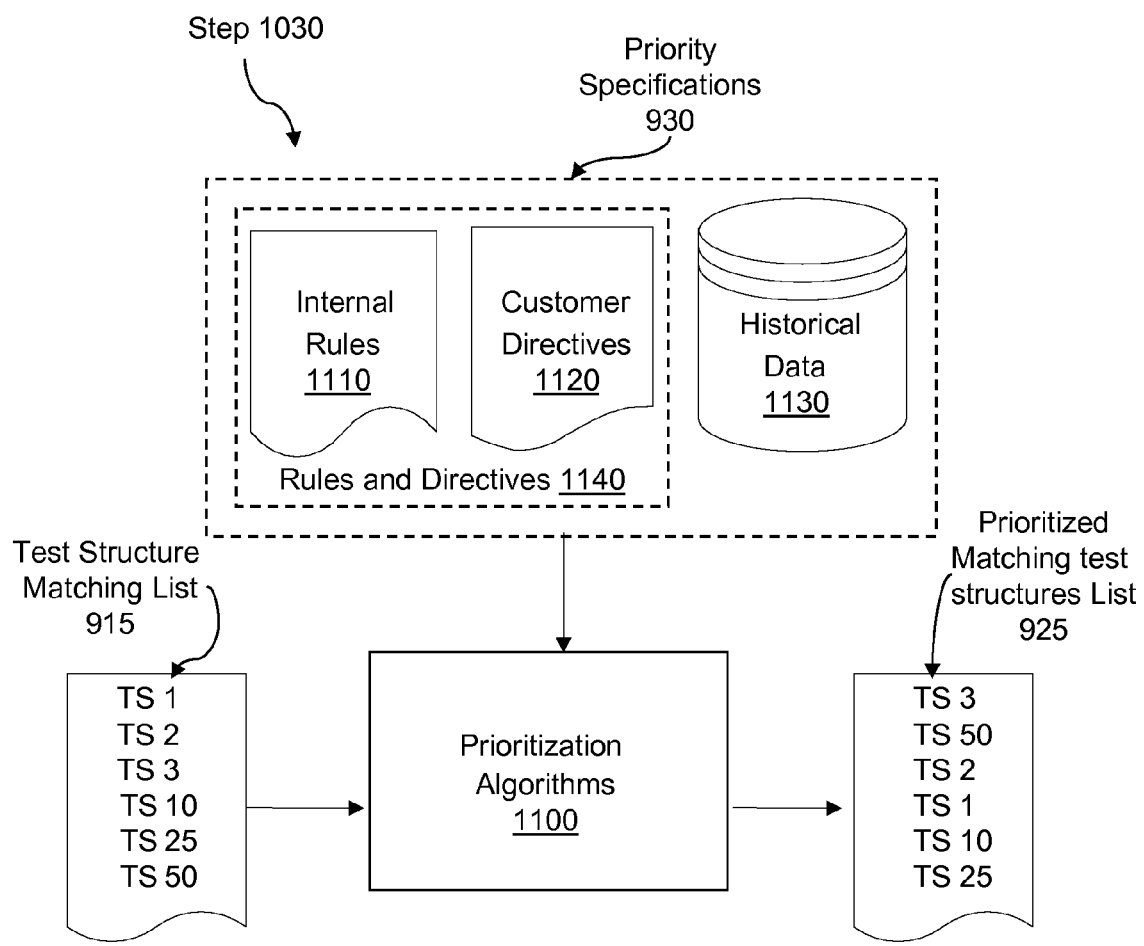
FIG. 11 is a detailed example of the step of prioritizing a match list of test structures.

FIG. 11 shows a detailed example diagram of prioritization step 1030 of method 1000. Test structure matching list 915 shows a list of matching test structures: TS1, TS2, TS3, TS10, TS 25, and TS50 which correspond to devices and/or elements in netlist 910. A plurality of prioritization algorithms 1100, prioritize list 915 to generate prioritized matching test structures list 925. Prioritization algorithms 1100 use data input from priority specifications 930. Priority specifications 930 includes rules and directives 1140, which further includes, for example, internal rules 1110 and customer directives 1120. Priority specifications 930 further includes historical data 1130. One of skill in the art would appreciate that there are many other data points which could be used to prioritize list 915. In this example, prioritized matching test structures list 925 shows test structures 100 prioritized in the following order: TS3, TS50, TS2, TS1, TS10, and TS25. Therefore, TS3 is the highest priority test structure 100 in this example and will be the first to be placed into netlist 910 in step 1040 by method 1000. Following the placement of TS3 is TS50, and so on.

FIGS. 12-17 show examples of test structure 100 placements within design 950. FIGS. 12-17 are only a few examples of placement configurations and should not be construed as limitations. As can be appreciated by one of ordinary skill in the art, test structures 100 may be placed anywhere in an integrated circuit design such that all design rules are satisfied and the purpose of test structure 100 is fulfilled. Additionally, the types of measurements desired will dictate the optimum placement or placements within an integrated circuit design.

Figure 12:
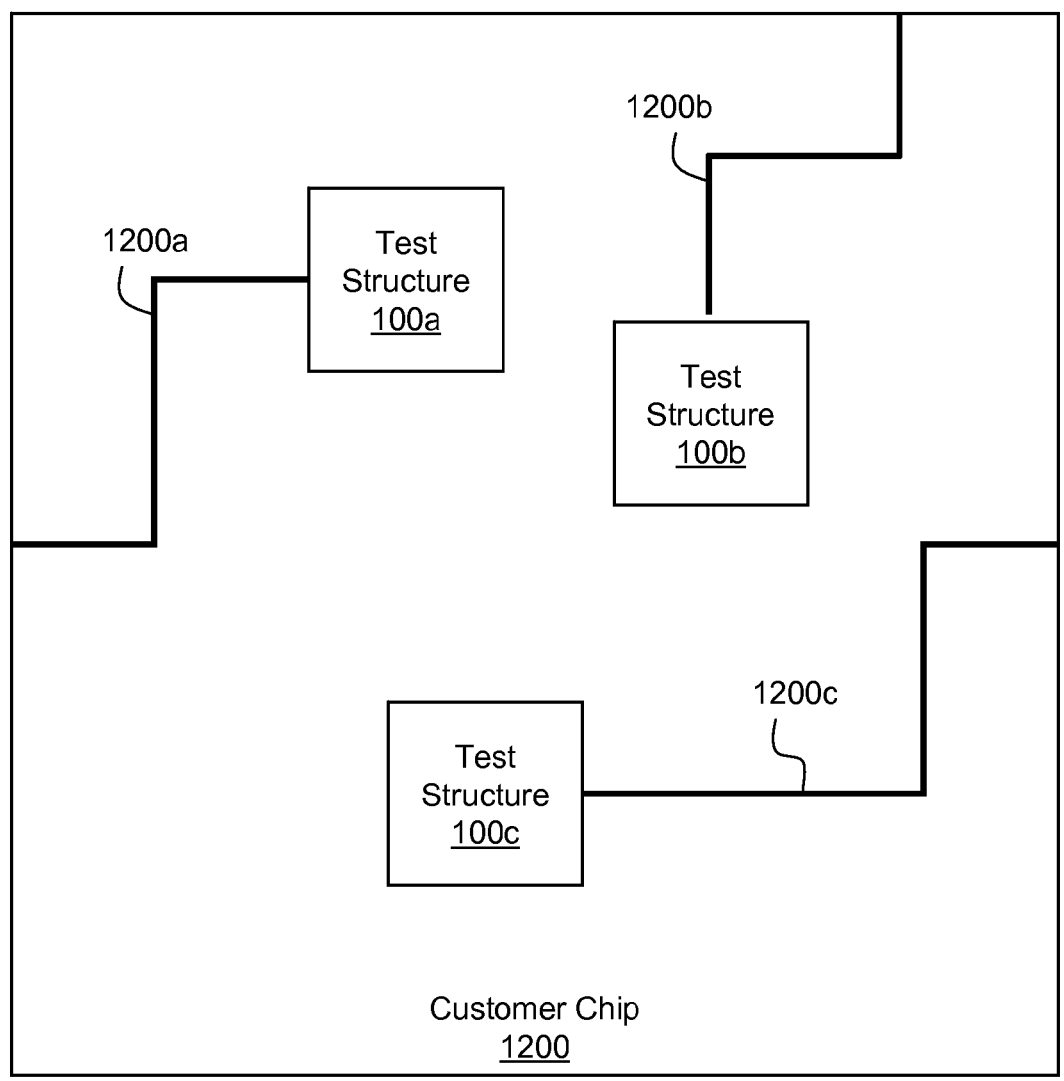
FIGS. 12-17 show examples of possible internal rules or customer directives used for prioritizing and assigning the test structures within an integrated circuit design according to an embodiment of the present invention.

FIG. 12 shows an example placement configuration that provides routing optimization by remaining within wiring limitations of a power supply, effectively minimizing IR drop through constraining metal routing distances. This is an example placement configuration in which internal rules and directives 1140 dictates that test structures 100*a, b,* and *c* need to be coupled to elements 1200*a*, 1200*b*, and 1200*c* respectively such that metal routing distances are minimized, thus minimizing IR drop. Test structures 100 are coupled to elements 1200 at the supply/Vdd/GND rail, as shown in FIG. 1.

Figure 13:
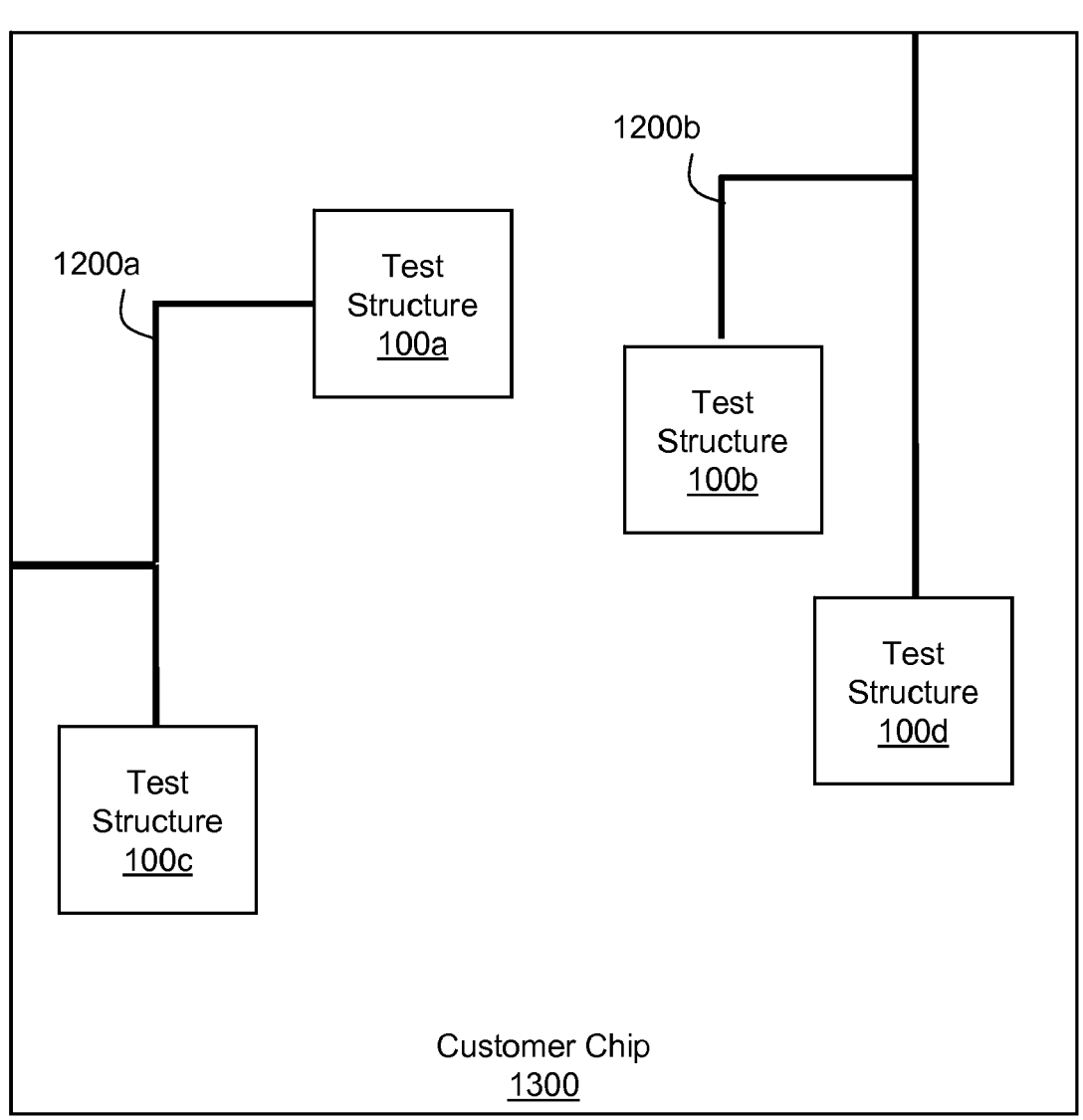

FIG. 13 shows a placement example where internal rules and directives 1140 dictates a fanout configuration for placement such that test structures 100*a* and 100*c* must be coupled to element 1200*a* and test structures 100*b* and 100*d* must be coupled to element 1200*b*. In this example, the fanout optimization maintains leakage limits, capacitive loading and balance loading for customer chip 1300.

Figure 14:
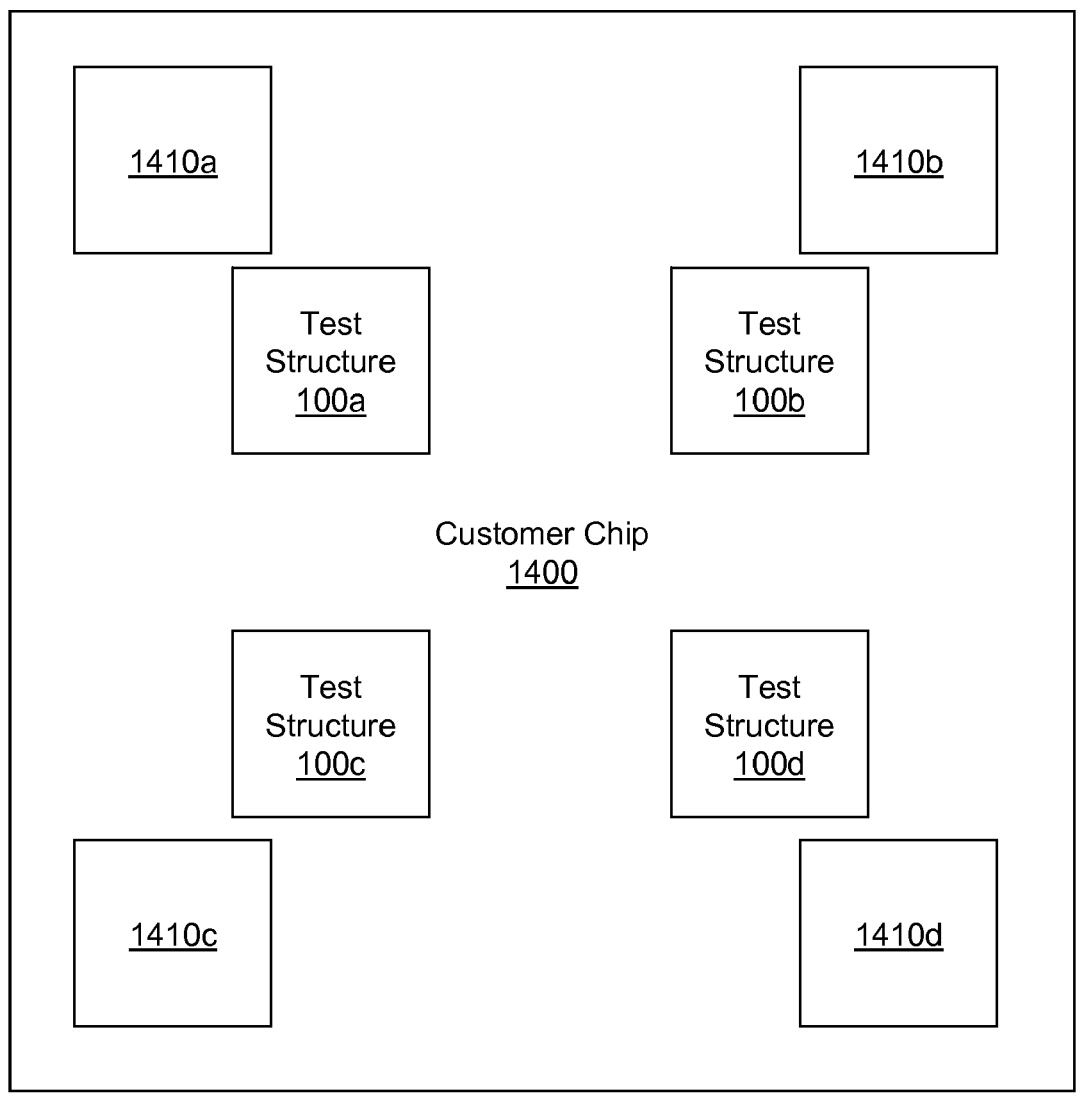

FIG. 14 shows a placement configuration example where internal rules and directives 1140 dictates a proximity requirement for a plurality of macros 1410*a-d* such that each of test structures 100*a-d* is located near to its respective macro 1410. For example, macro 1410 may be a PSRO. This configuration is used to validate, for example, screening methodology and AC to DC correlation.

Figure 15:
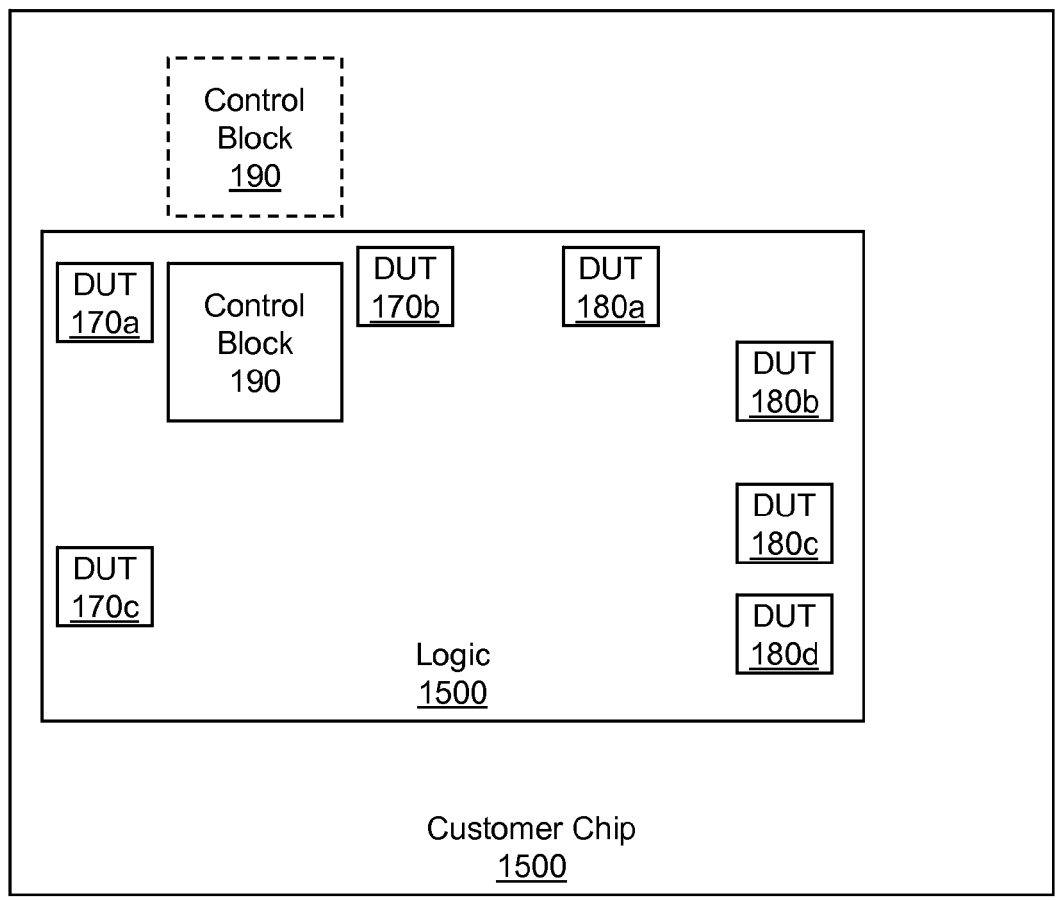

FIG. 15 shows a placement configuration example where internal rules and directives 1140 dictates a logic 1500 must comprise DUTs 170*a-c* and DUTs 180*a-d* and further that control block 190 may be placed either within logic 1500 or outside of logic 1500. FIG. 15 is further an example of a non-contiguous test structure 100.

Figure 16:
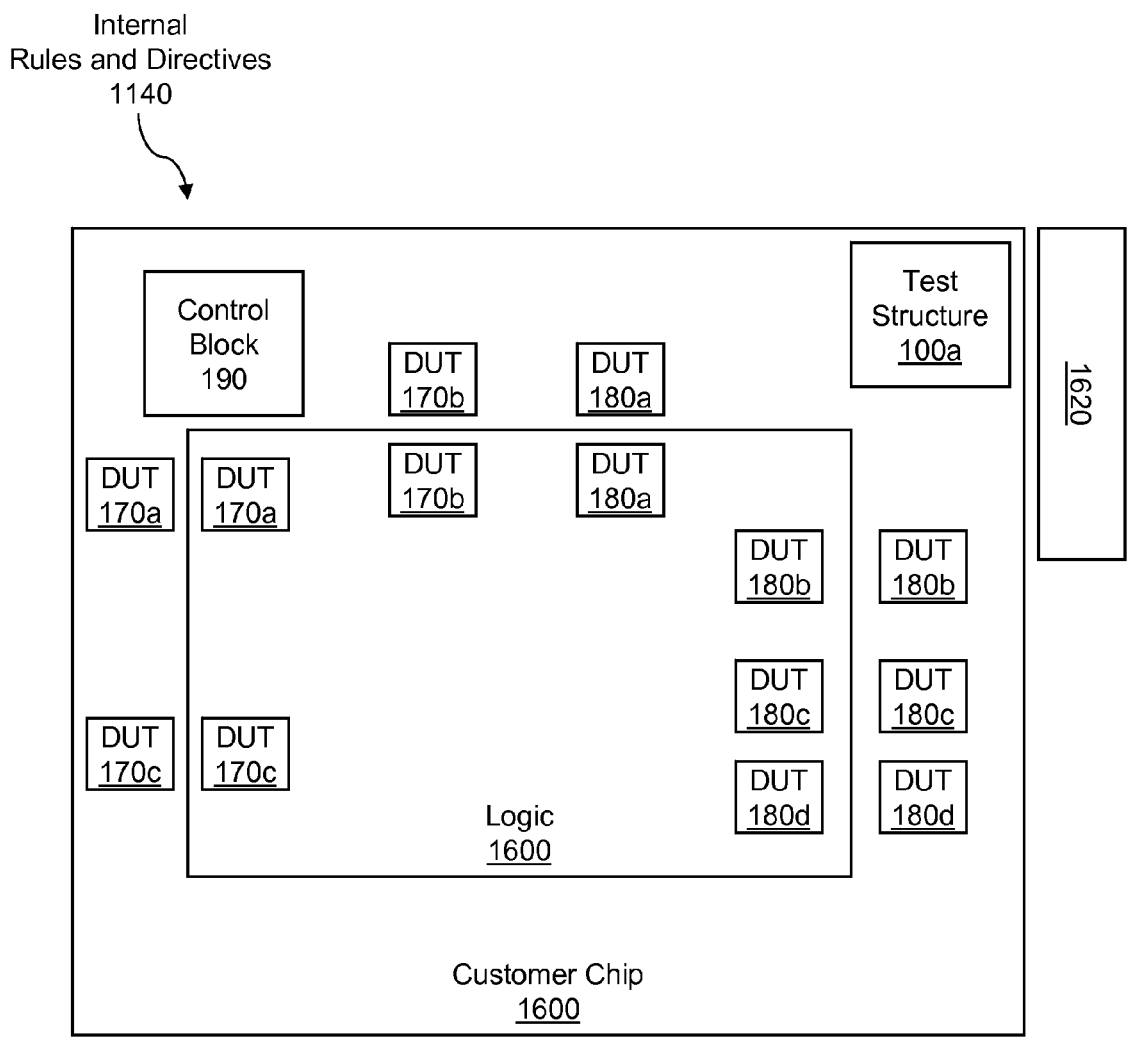

FIG. 16 is a configuration example of a placement for both a contiguous and non-contiguous test structure 100, where DUTs 170*a-c* and DUTs 180*a-d* may be placed both within and/or without a logic 1600 and control block 190 must be placed in proximity to logic 1600 for controlling DUTs 170*a-c* and DUTs 180*a-d*. Test structure 100*a* is a contiguous test structure which must be placed in proximity to element 1620. Element 1620 may be a kerf, for example.

Figure 17:
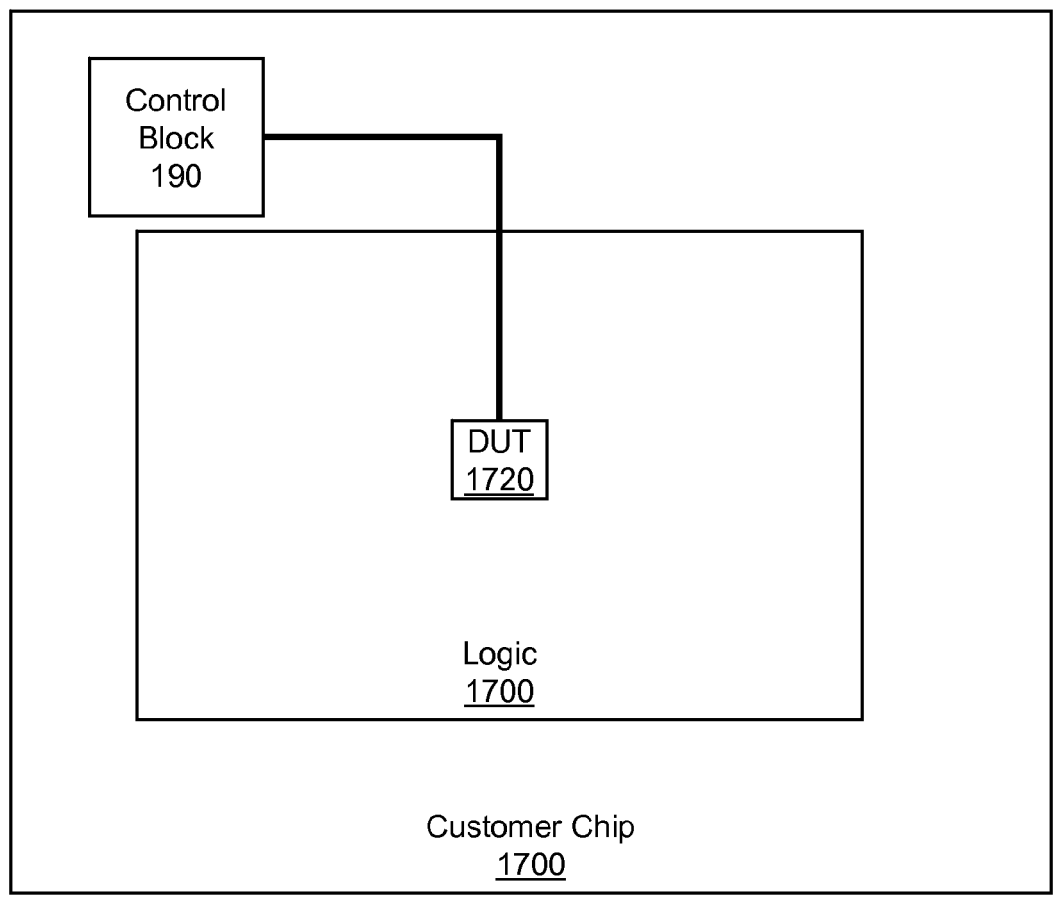

FIG. 17 shows a placement configuration example where internal rules and directives 1140 dictates a particular DUT 170 must be placed within a logic block 1700. Control block 190 has a proximity requirement in order to control DUT 170.

Figure 18:
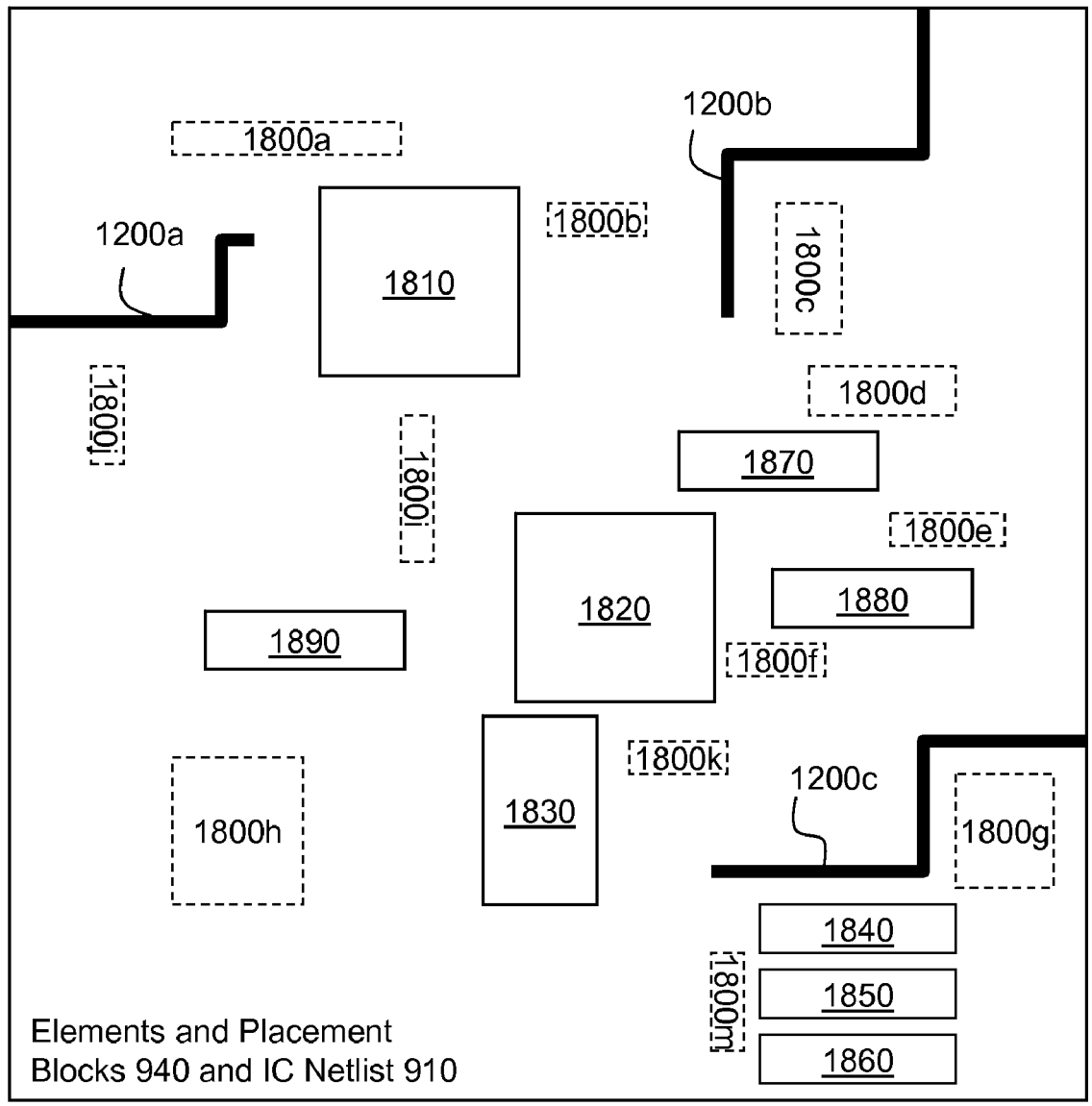
FIG. 18 is an example layout of a netlist including logic, elements for coupling test structures, and available chip area for placing test structures according to an embodiment of the present invention.
Figure 23:
FIG. 23 is a table illustrating possible placement assignment locations for each of the test structures.

FIG. 18 shows an example of a netlist 910 layout in combination with elements and placement blocks 940. Netlist 910 layout includes elements 1200*a*, 1200*b*, and 1200*c*, a plurality of placement blocks 1800, and a plurality of logic macros 1810-1890. Placement blocks 1800 are areas of available silicon that are large enough to hold contiguous and/or non-contiguous test structures 100. Test structures 100 from prioritized matching test structures list 925 are assigned to one or more of placement blocks 1800 in step 1040 of method 1000. A resulting placement options table 2300 is shown in FIG. 23.

Other example configurations, which are not shown include: placing enough test structures 100 in a customer chip such that the special placement of the test structures 100 provides systematic cross chip variations measurements. Placing a test structure 100 near a macro having critical timing requirements allows verification of ASST testing results and verification of AC testing results. Placing DUT 170 and/or DUT 180 within a macro's boundaries on a customer chip provides a controlled physical environment including similar backfill and is consistent with wiring density and device geometries. Yet another placement example includes placing a test structure 100 near a kerf and another test structure 100 near a macro to quantify DC offset from: chip to kerf, kerf to macro, and chip to macro.

An important process improvement provided by the present invention is that the parametric data collected from the test structures during test is fed back into the manufacturing line to adjust the responsible process steps necessary to bring the chip parameters into compliance with specifications. For example, a key process parameter that has heretofore gone unmonitored is N to P skew, which is a measurement of Nfet to Pfet of a deviation from their nominal threshold voltages. By using this invention the Nfet and Pfet skew can be adjusted to the correct the skew variation between the devices by changing one of the processes, such as the implant process, in the line to correct the skew.

Figure 19:
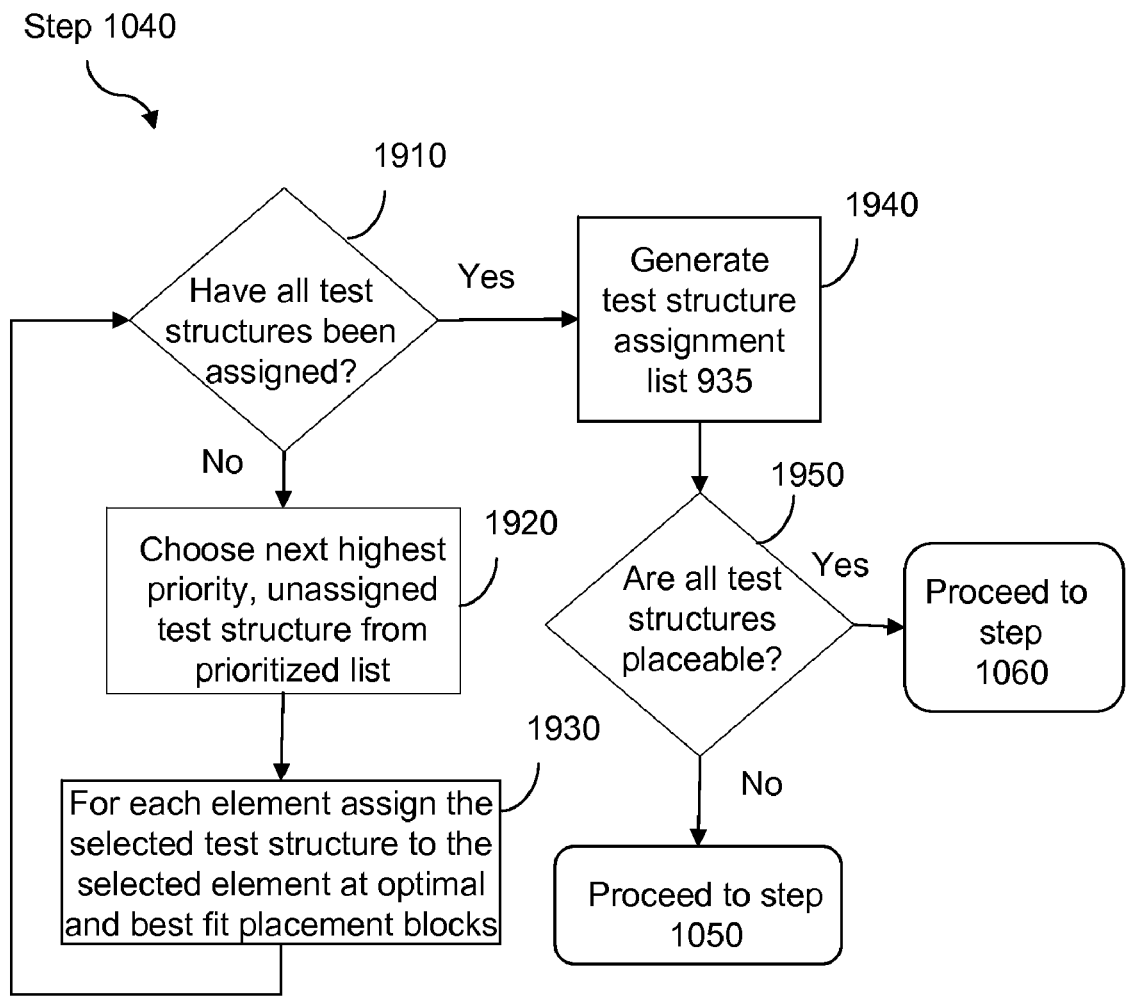
FIG. 19 is a flow diagram of an example method of assigning test structures to placeable areas (e.g. placement blocks) on a chip.

FIG. 19 is a detailed description of step 1040 of method 1000. In step 1910, method 1000 determines whether all test structures 100 in prioritized test structures list 925 have been assigned a placement block 1800. If yes method 1000 proceeds to step 1940, if no, method 1000 proceeds to step 1920.

In step 1920 method 1000 chooses the highest priority, unassigned test structure 100 from list 925 and proceeds to step 1930. For example, method 1000 chooses TS3 from list 925.

In step 1930 method 1000 analyzes each element 1200 and assigns selected test structure 100 to appropriate placement blocks 1800 for each element 1200. For example, method 1000 analyzes element 1200*a* and assigns placement blocks 1800*a*, 1800*b*, and 1800*i* as optimal placement areas for TS3 and records the data in placement options table 2300 (see FIG. 23). Method 1000 continues to element 1200*b* and assigns placement blocks 1800*b*, 1800*c'*, and 1800*d'* to TS3 in placement options table 2300. Whereby 1800*b* is an optimal placement block and 1800*c'* and 1800*d'* are best-fit placement blocks. Method 1000 proceeds to analyzing element 1200*c*. It assigns placement blocks 1800*k*, 1800*f*, 1800*g'* to TS3 in placement options table 2300, whereby 1800*k* and 1800*f* are optimal placement blocks and 1800*g'* is a best-fit placement block. Since there are no more elements 1200, method 1000 returns to step 1910.

In step 1940, method 1000 generates a test structure assignment list 935 and proceeds to step 1950. Step 1940 is explained in further detail in FIG. 24.

In step 1950, method 1000 determines whether all test structures 100 are placeable. If yes, method 1000 proceeds to step 1060 for synthesis. If no, method 1000 proceeds to step 1050 to store non-placeable test structures 100 in unused test structures 945 database.

Figure 20:
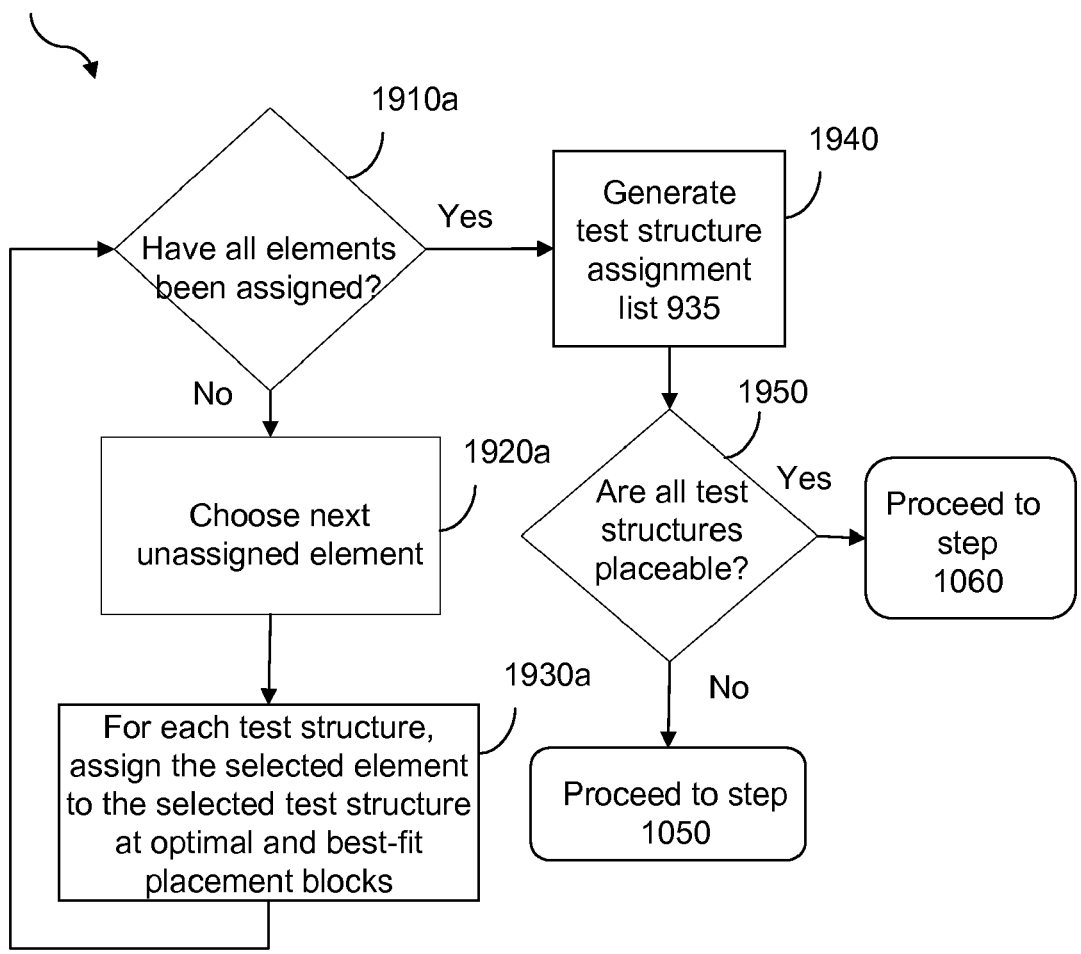
FIG. 20 illustrates a flow diagram of an example of an alternate method of assigning test structures to placement blocks on a chip.

FIG. 20 is an alternate step 1040. In step 1910*a* method 1000 determines whether all elements 1200 have been assigned. If yes method 1000 proceeds to step 1940, if no, method 1000 proceeds to step 1920*a*.

In step 1920*a* method 1000 chooses the next unassigned element 1200 and proceeds to step 1930*a*.

In step 1930*a* method 1000 assigns appropriate placement blocks 1800 to the selected element 1200 for each test structure 100. For example, method 1000 selects element 1200*a* and TS3. Method 1000 then assigns placement blocks 1800*a*, 1800*b*, and 1800*i* for TS3 and element 1200*a* in placement options table 2300. Next, method 1000 selects TS50 and assigns 1800*a'*, 1800*j'* as best-fit placement blocks 1800 in placement options table 2300. Method 1000 then selects TS2 and assigns best fit placement blocks 1800*a'*, 1800*j'*, 1800*i'* in placement options table 2300. Finally, method 1000 selects TS1 but no placement blocks 1800 are available for assignment at element 1200*a* which meet requirements for TS1 so no placement blocks 1800 are entered into placement options table 2300. Method 1000 returns to step 1910.

Figure 21:
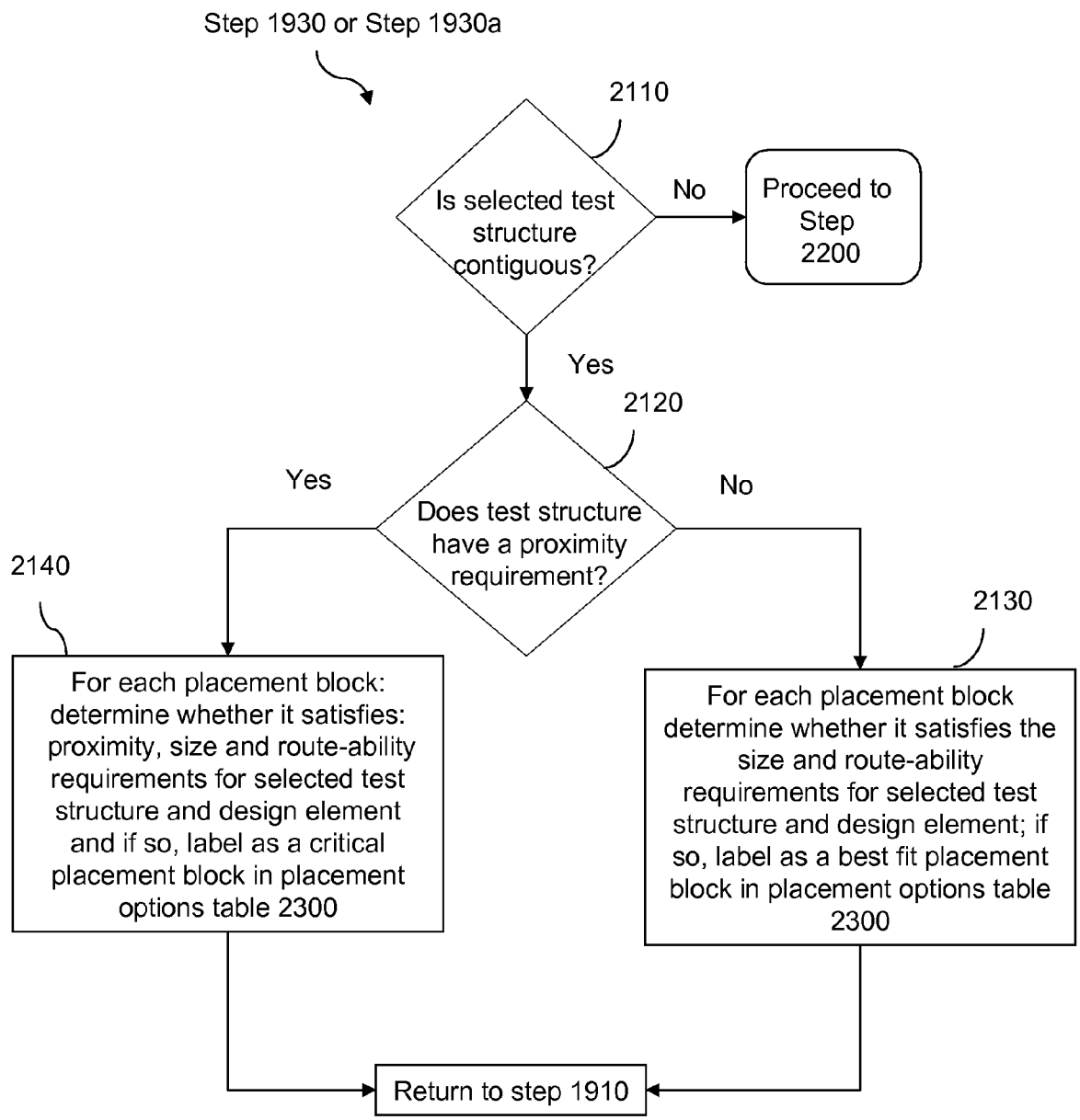
FIG. 21 illustrates a flow diagram further detailing the method of assigning test structures to placement blocks on a chip.

FIG. 21 shows a flow diagram of the details of steps 1930 or 1930*a*. In step 2110, method 1000 determines whether the selected test structure is contiguous. If yes, method 1000 proceeds to step 2200. If no, method 1000 proceeds to step 2120.

In step 2120, method 1000 determines whether selected test structure 100 has a proximity requirement (typically established in customer directives 1120) to a particular element, logic block, core, macro, etc. If yes, method 1000 proceeds to step 2140, if no, method 1000 proceeds to step 2130.

In step 2130, method 1000 analyzes each placement block 1800 to determine whether it satisfies size and route-ability requirements for the selected test structure 100 and design element 1200; if yes, method 1000 labels the selected placement block 1800 as a possible placement block 1800 option in placement options table 2300. Method 1000 returns to step 1910.

In step 2140, method 1000 analyzes each placement block 1800 to determine whether it satisfies proximity, size, and route-ability requirements for the selected test structure 100 and design element 1200; if yes, method 1000 labels the selected placement block 1800 as an optimal placement block 1800 option in placement options table 2300. Method 1000 returns to step 1910.

Figure 22:
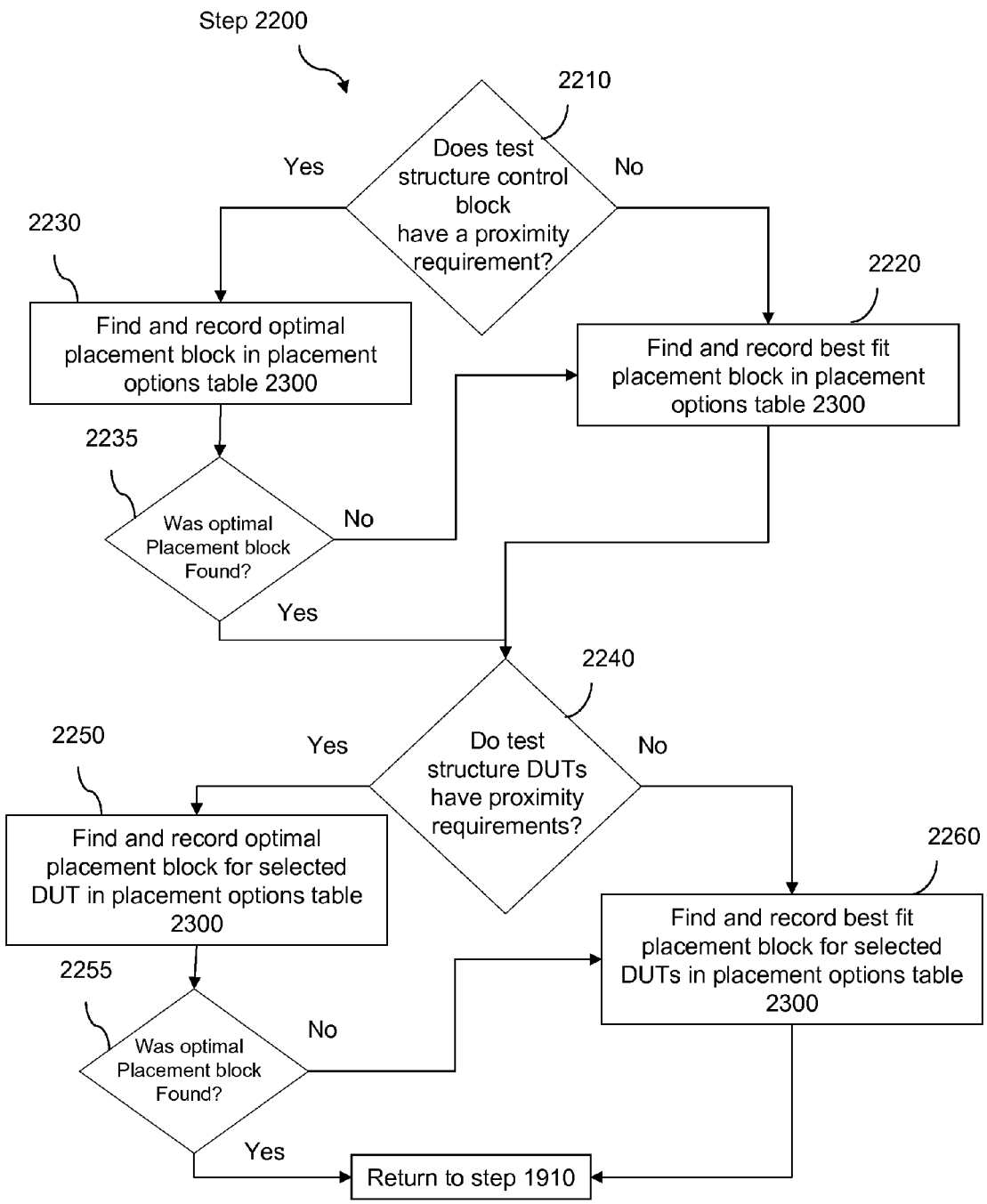
FIG. 22 illustrates a flow diagram of a method of identifying optimal and best fit placement blocks for each of the test structures.

FIG. 22 is a flow diagram of step 2200, which assigns placement block 1800 options to non-contiguous test structures 100. In step 2210 method 1000 determines whether control block 190 of the selected test structure 100 have a proximity requirement; if yes, method 1000 proceeds to step 2230, if no method 1000 proceeds to step 2220.

In step 2220, method 1000 analyzes each placement block 1800 to determine whether it satisfies size and routeability requirements for selected test structure control block 190 and selected element 1200; if so, label selected placement block 1800 as a possible placement block 1800' in placement options table 2300. When all placement blocks 1800 have been analyzed, method 1000 proceeds to decision step 2240.

In step 2230, for each placement block 1800, method 1000 analyzes whether it satisfies proximity, size, and route-ability requirements for selected test structure control block 190 and selected element 1200; if so, label selected placement block 1800 as optimal placement block 1800 in placement options table 2300. When all placement blocks 1800 have been analyzed, method 1000 proceeds to decision step 2235.

In step 2235 method 1000 determines whether an optimal placement block 1800 was found for the selected control block 190 of test structure 100; if yes method 1000 proceeds to step 2235, if no, method 1000 proceeds to step 2220.

In step 2240, method 1000 determines whether DUTs 170 and/or 180 associated with the selected test structure 100 have proximity requirements; if yes, method 1000 proceeds to step 2250, if no, method 1000 proceeds to step 2260.

In step 2250, for each placement block 1800, method 1000 analyzes whether it satisfies proximity, size, and routeability requirements for selected test structure 100 DUTs 170 and/or 180 and selected element 1200; if so, label selected placement block 1800 as optimal placement block 1800 in placement options table 2300. When all placement blocks 1800 have been analyzed, method 1000 proceeds to step 2255.

In step 2255 method 1000 determines whether an optimal placement block 1800 was found for the selected DUTs 170 and/or 180 of test structure 100; if yes method 1000 returns to step 1910, if no, method 1000 proceeds to step 2260.

In step 2260, method 1000 analyzes each placement block 1800 to determine whether it satisfies size and route-ability requirements for selected DUTs 170 and/or 180 and selected element 1200; if so, label selected placement block 1800 as a best fit possible placement block 1800' in placement options table 2300. When all placement blocks 1800 have been analyzed, method 1000 returns to step 1910.

FIG. 23 shows an example placement options table 2300. For each applicable test structure 100 and each applicable element 1200, the optimal placement blocks 1800 and best fit placement blocks 1800' are recorded in placement options table 2300.

Figure 24:
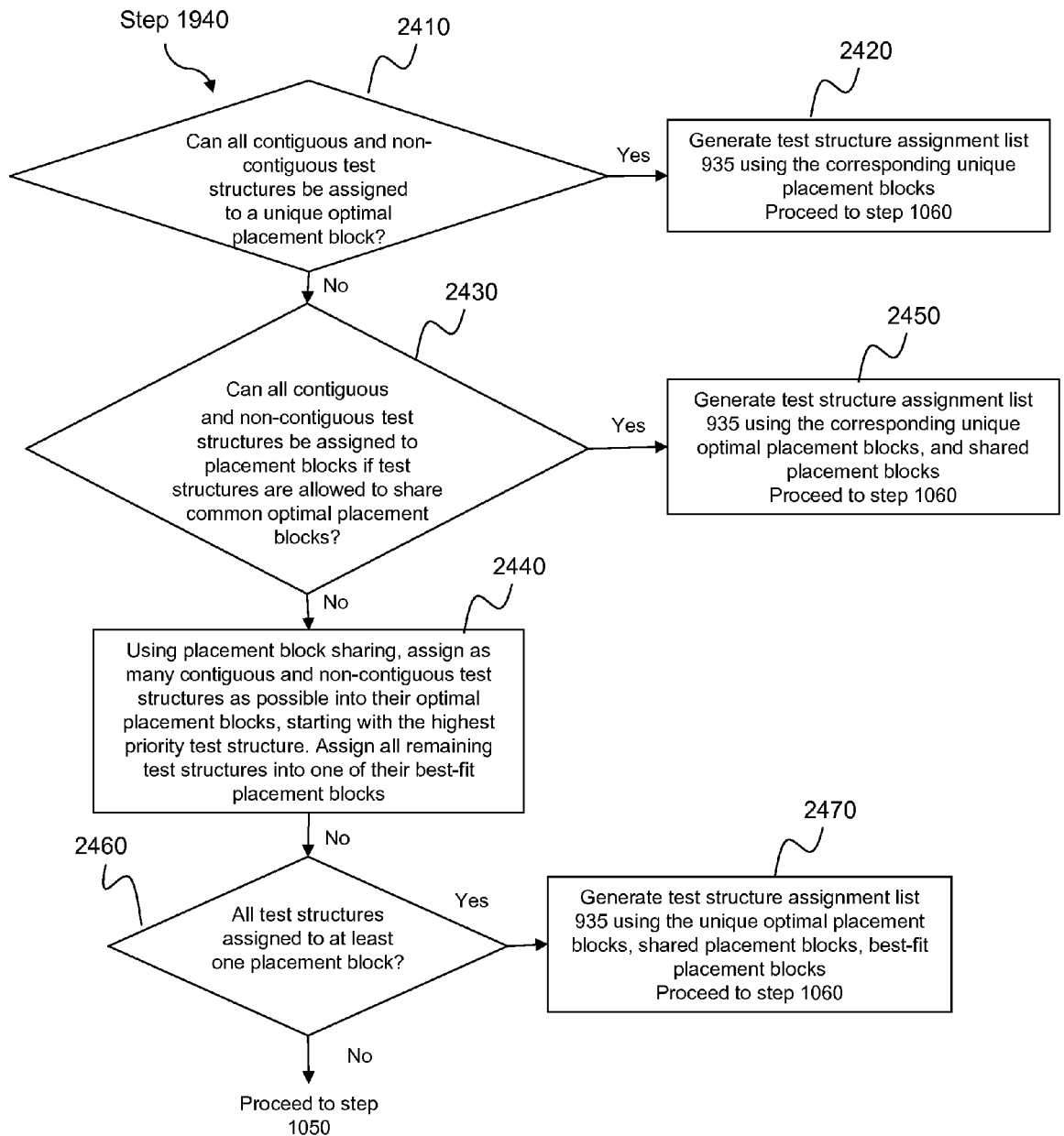
FIG. 24 illustrates a flow diagram of a method of making a final test structure assignment table.

FIG. 24 shows a flow diagram of a detail of step 1940. In decision step 2410, method 1000 determines whether all contiguous and non-contiguous test structures 100 can be assigned to optimal placement blocks 1800; if yes, method 1000 proceeds to step 2420, if no, method 1000 proceeds to step 2430.

In step 2430, method 1000 determines whether all contiguous and non-contiguous test structures be assigned to placement blocks 1800 if test structures 100 are allowed to share common optimal placement blocks 1800. If yes, method 1000 proceeds to step 2450, if no, method 1000 proceeds to step 2440.

In step 2440, method 1000 assigns as many contiguous and non-contiguous test structures 100 as possible into their respective optimal placement blocks 1800 starting with the highest priority test structures 100. All remaining test structures 100 are then assigned to their respective best-fit placement blocks 1800'. Method 1000 proceeds to step 2460.

In step 2460, method 1000 determines whether all test structures 100 are assigned to at least one placement block 1800 or 1800'. If yes, method 1000 proceeds to step 2470, if no, method 1000 proceeds to step 1050 to store non-placeable test structures 100 into unused test structures 945 database.

In step 2420, method 1000 generates test structure assignment list 935 using the corresponding optimal placement blocks 1800 and proceeds to step 1060.

In step 2450, method 1000 generates test structure assignment list 935 using the corresponding optimal placement blocks 1800 and shared placement blocks 1800. Method 1000 proceeds to step 1060.

In step 2470, method 1000 generates test structure assignment list 935 using the optimal placements blocks 1800, shared placement blocks 1800, and best-fit placement blocks 1800'. Method 1000 proceeds to step 1060.

FIG. 25 is an example test structure assignment list 935 for elements 1200*a-c*, Test structures TS3, TS50, DUTs 170*a-d*, TS2, and TS1. In this example TS1 could not be placed and therefore will be added to unused test structure 945 database. TS2 will share placement block 1800*b* with TS3, and DUT 170*d* will be tied off (e.g. FET(s) that are in the off position or some other low leakage configuration).

Figure 26:
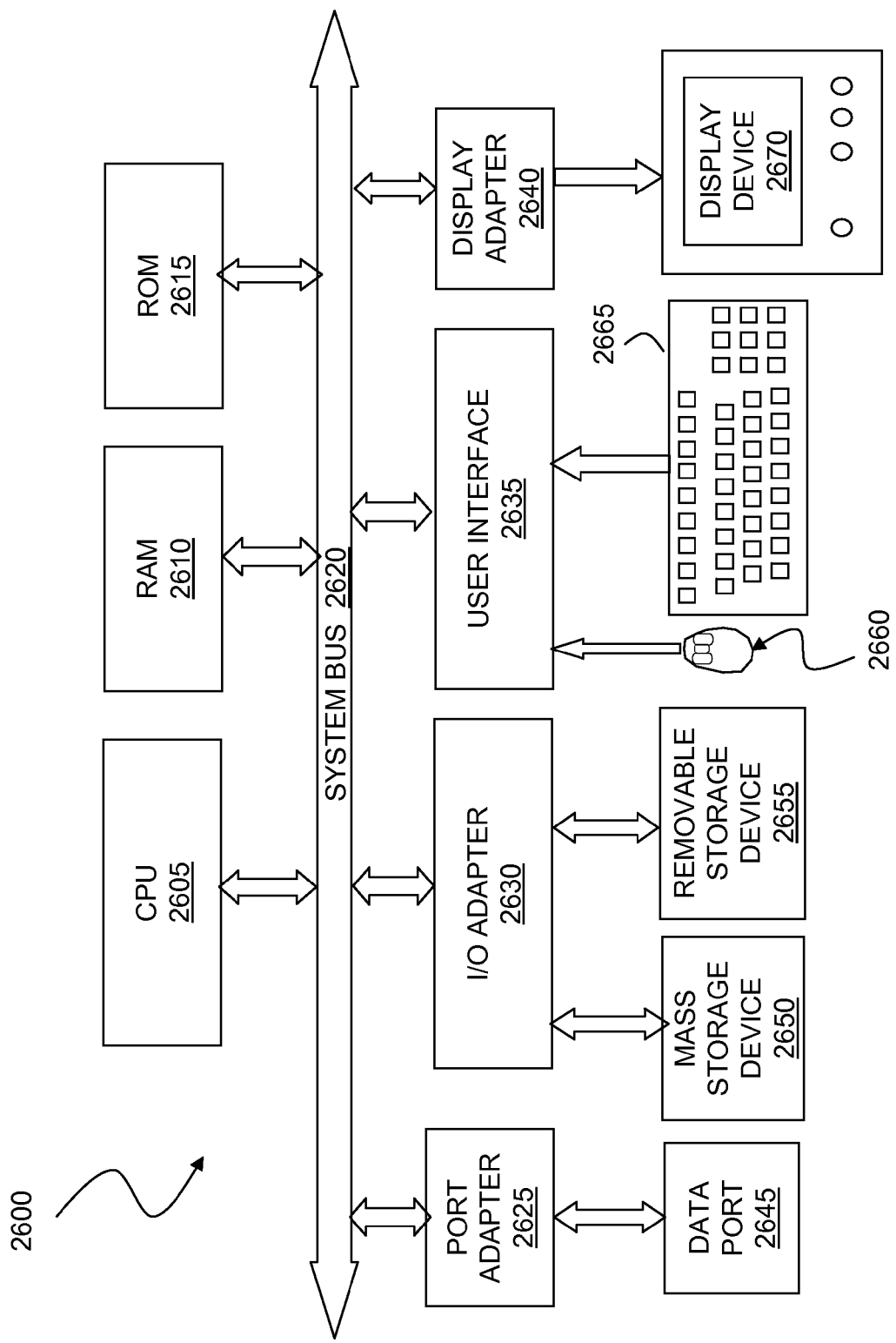
FIG. 26 shows a block diagram of a computer system comprising computer readable media for performing the function of the present invention.

FIG. 26 illustrates a block diagram of a general-purpose computer system which can be used to implement the system and method described herein. The system and method may be coded as a set of instructions on removable or hard media for use by general-purpose computer. FIG. 26 is a schematic block diagram of a general-purpose computer for practicing the present invention. FIG. 26 shows a computer system 2600, which has at least one microprocessor or central processing unit (CPU) 2605. CPU 2605 is interconnected via a system bus 2620 to a random access memory (RAM) 2610, a read-only memory (ROM) 2615, an input/output (I/O) adapter 2630 for connecting a removable and/or program storage device 2655 and a mass data and/or program storage device 2650, a user interface 2635 for connecting a keyboard 2665 and a mouse 2660, a port adapter 2625 for connecting a data port 2645 and a display adapter 2640 for connecting a display device 2670. ROM 2615 contains the basic operating system for computer system 2600. Examples of removable data and/or program storage device 2655 include magnetic media such as floppy drives, tape drives, portable flash drives, zip drives, and optical media such as CD ROM or DVD drives. Examples of mass data and/or program storage device 2650 include hard disk drives and non-volatile memory such as flash memory. In addition to keyboard 2665 and mouse 2660, other user input devices such as trackballs, writing tablets, pressure pads, microphones, light pens and position-sensing screen displays may be connected to user interface 2635. Examples of display device 2670 include cathode-ray tubes (CRT) and liquid crystal displays (LCD).

A computer program may be created by one of skill in the art and stored in computer system 2600 or a data and/or removable program storage device 2665 to simplify the practicing of this invention. In operation, information for the computer program created to run the present invention is loaded on the appropriate removable data and/or program storage device 2655, fed through data port 2645 or entered using keyboard 2665. A user controls the program by manipulating functions performed by the computer program and providing other data inputs via any of the above mentioned data input means. Display device 2670 provides a means for the user to accurately control the computer program and perform the desired tasks described herein.

The above description and drawings are only to be considered illustrative of exemplary embodiments, which achieve the features and advantages of the invention. It should be appreciated by one of ordinary skill in the art that modification and substitutions to specific layout designs, systems for performing the tests and analysis, and the devices themselves can be made without departing from the spirit and scope of the invention. Accordingly, the invention is not to be considered as being limited by the foregoing description and drawings.

What is claimed is:

1. A method comprising:
    identifying a first test structure in a library;
    the first test structure having a first device under test (DUT) which matches at least one device in an integrated circuit (IC) design; and
    modifying by microprocessor, the integrated circuit design to include the first test structure; wherein the first test structure is used to test the IC during manufacturing to monitor the health of a manufacturing line and adjust at least one manufacturing apparatus or at least one process;
    the test structure further comprising a logic controller having a decoder which activates the DUT;
    a decode level translator which provides a required gate voltage to the DUT;
    at least one supply/protect/isolation (SPI) circuit which comprises
    a supply circuit which provides a source voltage to the DUT;
    an isolation circuit which controls the supply circuit to isolate the DUT during test; and
    a protect circuit which protects the supply circuit from leakage current when the test structure is inactive; and
    an SPI control circuit which enables or disables the SPI circuit.

2. The method of claim 1 further comprising a step of generating a list of a plurality of test structures each of which comprise at least one DUT which matches at least one of a plurality of devices in the integrated circuit design.

3. The method of claim 2 further comprising a step of generating a prioritized list comprising a plurality of prioritized test structures from the list of a plurality of test structures using at least one prioritization algorithm and at least one of a plurality of customer directives, a plurality of historical data, or a plurality of internal rules.

4. The method of claim 3, wherein the step of modifying the integrated circuit design comprises determining whether area is available in the integrated circuit for at least one of the prioritized test structures.

5. The method of claim 4 further comprising a step of determining whether a predetermined element is available in the integrated circuit for coupling to the at least one of the prioritized test structures.

6. The method of claim 5 further comprising a step of assigning the at least one of the prioritized test structures to a predetermined element.

7. The method of claim 2 further comprising a step of storing in a database at least one of the plurality of test structures which is in the list but which is not in the integrated circuit design.

8. The method of claim 3, wherein the step of modifying comprises using a plurality of placement algorithms to place the at least one of the prioritized test structures into the design.

9. The method of claim 8 further comprising a step of compiling the modified design; and
performing a plurality of design checking algorithms.

10. The method of claim 9 further comprising the step of adjusting the modified design to satisfy a plurality of specifications.

11. The method of claim 10 further comprising a step of manufacturing an integrated circuit corresponding to the modified design; and
measuring a parameter of the at least one device using the test structure during a manufacturing test.

12. The method of claim 11, wherein the at least one device is a performance screen ring oscillator (PSRO).

13. A system for testing individual circuit chip parameters comprising:
an IC design comprising at least one device and at least one element;
a library comprising at least one test structure;
a first list comprising at least one test structure which matches the at least one device;
a second list comprising a plurality of prioritized matching test structures and is derived from the first list and a first database comprising priority specifications;
a third list which is generated from the second list and a second database comprising a plurality of elements; and
a modified IC design comprising at least one prioritized matching test structure coupled to the at least one element;
wherein the test structure is used to test the IC during manufacturing to monitor the health of a manufacturing line and adjust at least one manufacturing apparatus or at least one manufacturing process.

14. The system of claim 13, wherein the first database comprises at least one of a plurality of customer directives, a plurality of historical data, or a plurality of internal rules.

15. The system of claim 13 further comprising at least one placement algorithm for placing the at least one prioritized matching test structure into the IC design.

16. The system of claim 15, wherein a back-fill area of the IC design comprises the prioritized matching test structure.

17. The system of claim 13 further comprising a third database comprising the matching test structures which are not in the third list.

18. The system of claim 13, wherein the element provides access to the test structure such that a parameter of the test structure in the IC is measurable.

19. A computer readable program product comprising a computer readable medium having computer usable program code for modifying an IC design, the computer program product comprising:
computer usable program code for identifying a first test structure in a library;
the first test structure having a first device under test (DUT) which matches at least one device in an integrated circuit (IC) design; and
computer usable program code for modifying the IC design to include the first test structure;
wherein the first test structure is used to test the IC during manufacturing to monitor the health of a manufacturing line and adjust at least one manufacturing apparatus or at least one process;
the test structure further comprising
a logic controller having a decoder which activates the DUT;
a decode level translator which provides a required gate voltage to the DUT;
at least one supply/protect/isolation (SPI) circuit which comprises
a supply circuit which provides a source voltage to the DUT;
an isolation circuit which controls the supply circuit to isolate the DUT during test; and
a protect circuit which protects the supply circuit from leakage current when the test structure is inactive; and
an SPI control circuit which enables or disables the SPI circuit.

20. The computer program product of claim 19 further comprising:
computer usable program code for prioritizing a list comprising a plurality of matching test structures; and
computer usable program code for assigning the highest priority matching test structure to at least one element in the IC design.

* * * * *